United States Patent
Wang et al.

(10) Patent No.: US 7,808,097 B2
(45) Date of Patent: Oct. 5, 2010

(54) LOW TEMPERATURE CO-FIRED CERAMIC (LTCC) TAPE COMPOSITIONS, LIGHT-EMITTING DIODE (LED) MODULES, LIGHTING DEVICES AND METHODS OF FORMING THEREOF

(75) Inventors: Carl B. Wang, Raleigh, NC (US); Shih-Ming Kao, Taoyuan County (TW); Yu-Cheng Lin, Taoyuan (TW); Jaw-Shin Cheng, Taipei (TW)

(73) Assignee: E.I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 12/467,604

(22) Filed: Jul. 28, 2009

(65) Prior Publication Data
US 2009/0278162 A1    Nov. 12, 2009

Related U.S. Application Data

(62) Division of application No. 11/510,170, filed on Aug. 25, 2006, now Pat. No. 7,550,319.

(51) Int. Cl.
*H01L 23/053* (2006.01)
*H01L 31/0232* (2006.01)

(52) U.S. Cl. .................. 257/701; 257/98; 257/432; 257/706; 257/E23.173

(58) Field of Classification Search .................. 257/701, 257/98, 432, 706, E23.173
See application file for complete search history.

(56) References Cited

U.S. PATENT DOCUMENTS

| | | |
|---|---|---|
| 4,381,945 A | 5/1983 | Nair |
| 4,536,535 A | 8/1985 | Usala |
| 4,654,095 A | 3/1987 | Steinberg |
| 5,256,469 A | 10/1993 | Cherukuri et al. ............ 428/210 |
| 5,474,741 A | 12/1995 | Mikeska et al. |
| 5,923,084 A | 7/1999 | Inoue et al. .................. 257/712 |
| 6,147,019 A | 11/2000 | Donohue |
| 6,217,821 B1 | 4/2001 | Donohue |
| 6,268,654 B1 | 7/2001 | Glenn et al. ................. 257/704 |
| 6,455,930 B1 | 9/2002 | Palanisamy et al. ......... 257/706 |
| 6,548,895 B1 | 4/2003 | Benavides et al. .......... 257/712 |
| 7,025,651 B2 | 4/2006 | Song et al. .................... 445/50 |
| 7,045,828 B2 * | 5/2006 | Shimizu et al. ............... 257/98 |
| 7,095,053 B2 * | 8/2006 | Mazzochette et al. ......... 257/81 |
| 7,176,502 B2 | 2/2007 | Mazzochette et al. ......... 257/99 |
| 2002/0149102 A1 | 10/2002 | Hashemi et al. ............. 257/706 |
| 2002/0163006 A1 * | 11/2002 | Yoganandan et al. .......... 257/81 |
| 2002/0175621 A1 * | 11/2002 | Song et al. ................... 313/515 |
| 2002/0176250 A1 * | 11/2002 | Bohler et al. ............... 362/236 |
| 2003/0034564 A1 * | 2/2003 | Palanisamy et al. ......... 257/778 |

FOREIGN PATENT DOCUMENTS

GB    772675    4/1957

* cited by examiner

*Primary Examiner*—Nitin Parekh

(57) ABSTRACT

The present invention provides LTCC (low temperature co-fired ceramic) tape compositions and demonstrates the use of said LTCC tape(s) in the formation of Light-Emitting Diode (LED) chip carriers and modules for various lighting applications. The present invention also provides for the use of (LTCC) tape and LED modules in the formation of lighting devices including, but not limited to, LED devices, High Brightness (HB) LED backlights, display-related light sources, automotive lighting, decorative lighting, signage and advertisement lighting, and information display lighting.

3 Claims, 11 Drawing Sheets

US 7,808,097 B2

LOW TEMPERATURE CO-FIRED CERAMIC (LTCC) TAPE COMPOSITIONS, LIGHT-EMITTING DIODE (LED) MODULES, LIGHTING DEVICES AND METHODS OF FORMING THEREOF

FIELD OF INVENTION

This is a divisional application of U.S. Ser. No. 11/510,170 filed on Aug. 25, 2006. This invention is related to LTCC (low temperature co-fired ceramic) tape compositions and the use of said LTCC tape in the formation of Light Emitting Diode (LED) chip carriers and modules for various lighting applications including, but not limited to, LED backlights, Liquid Crystal Display (LCD) lighting, display-related light sources, automotive lighting, decorative lighting, signage and advertisement lighting, and information display applications.

TECHNICAL BACKGROUND OF THE INVENTION

Solid state electronic devices can be fabricated with conjugated organic polymer layers. Conjugated polymer-based diodes and particularly light emitting diodes (LEDs) and light-detecting diodes are especially attractive due to their potential for use in display and sensor technology. This class of devices has a structure that includes a layer or film of an electrophotoactive conjugated organic polymer bounded on opposite sides by electrodes (anode and cathode) and carried on a solid substrate.

Generally, materials for use as active layers in polymer diodes and particularly PLEDs include semiconducting conjugated polymers that exhibit photoluminescence. In certain preferred settings, the polymers exhibit photoluminescence and are soluble and processible from solution into uniform thin films.

The anodes of these organic polymer-based electronic devices are conventionally constructed of a relatively high work function metal. This anode serves to inject holes into the otherwise filled p-band of the semiconducting, luminescent polymer.

Relatively low work function metals, such as barium or calcium, are preferred as the cathode material in many structures. This low work function cathode serves to inject electrons into the otherwise empty p*-band of the semiconducting, luminescent polymer. The holes injected at the anode and the electrons injected at the cathode recombine radiatively within the active layer and light is emitted.

LED lighting can commonly be characterized by on-axis luminous intensity expressed in candela. Intensity describes the flux per solid angle radiated from a source of finite area. Furthermore, flux is the total amount of light emitted from a source in all directions. For the purpose of this invention, flux will be used to describe the brightness of LEDs.

Radiometric light is specified according to its radiant energy and power without regard for the visual effects of the radiation. Photometric light is specified in terms of human visible response according to the CIE standard observer response curve. Furthermore, in the fields of photonics and solid state physics, luminous efficacy is defined as the conversion between photometric flux, expressed in lumens, and radiometric flux, expressed in watts.

It is noted that the luminous efficacy is a function of the dominant wavelength of a specific LED lighting source. For example, an Indium Gallium Nitride (InGaN) LED shows increasing luminous efficacy from 85 to 600 lumens per watt corresponding to a shifting of the dominant wavelength from 470 to 560 nm. On the other hand, an Aluminum Indium Gallium Phosphide (AlInGaP) shows decreasing luminous efficacy from 580 to 800 lumens per watt corresponding to a shifting of the dominant wavelength from 580 to 640 nm. For the purpose of this invention, luminous efficacy at the peak transmittance of LED is referred.

Most typical prior art LEDs are designed to operate no more than 30-60 milliwatts of electrical power. More recently, commercial LEDs capable of continuous use at one watt of input power were introduced. These LEDs use much larger semiconductor chips than previous LEDs to handle the large power. In order to dissipate heat to minimize junction temperature and maintain lighting performance, these larger chips are normally mounted to a more effective thermal conductor (such as metal slugs) than previous LED structures.

Typically, the 5-watt LEDs are available with efficacy of 18-22 lumens per watt, the 10-watt LEDs are available with efficacy of 60 lumens per watt. These 10-watt LED light devices will produce about as much light as a common 50-watt incandescent bulb and will facilitate use of LEDs for general illumination needs.

Despite the prior art LED devices currently available, a need still exists for improved LED modules which can provide improved performance characteristics, such as increased heat dissipation qualities, improved manufacturing processes, and lower cost benefits. Other benefits include closer TCE match to the chip, smaller size, light weight, environmental stability, increased circuit integration capability, enhanced light reflectivity, simplified fabrication (such as co-fireability of a multilayer structure), higher yield, broader process tolerance, high mechanical strength, and effective heat dissipation. None of the prior art LEDs provide for the use of LTCC technology or the benefits associated with the incorporation of LTCC technology, which include longer device life.

Various design and configuration of the HB (High Brightness) LED chip carrier devices were provided in the prior art. However, they all presented different problems related to various functions, manufacturability, and cost. Functioning LED devices with equal or greater than 0.5 Watt and preferably 1 Watt power rating are still needed for lighting applications, including HB LED modules for LCD applications, which allow for the improvement in heat dissipation properties to improve the overall color quality of emitting light diode modules and increase the module life. The present invention has provided such materials, methods, chip carriers, and modules to allow for such an innovation in lighting technology.

SUMMARY OF THE INVENTION

The present invention provides a light emitting diode chip carrier and a method of forming a light emitting diode chip carrier comprising: (a) providing two or more LTCC tape layers; (b) forming one or more cavities in said tape layers; and (c) providing at least two electrical vias and at least one thermal via in said tape layers; and wherein said LTCC tape layers provide a desired circuit pattern and said circuit pattern is electrically connected through said electrical vias, thus, forming a functioning chip carrier.

The present invention further provides a light emitting diode and method of forming a light emitting diode module comprising: providing two or more LTCC tape layers; forming one or more cavities in said tape layers; providing at least two electrical vias and at least one thermal via in said tape layers; providing at least one functioning light emitting diode chip; wherein said LTCC tape layers provide a desired circuit pattern and said circuit pattern is electrically connected through said electrical vias, thus, forming a functioning chip carrier and wherein at least one functioning light emitting diode chip is mounted to said chip carrier. Additionally, the light emitting diode module is disclosed wherein at least one thermal via is connected to a heat sink and wherein said thermal via dissipates heat released from said functioning light emitting diode chip through its connection to said heat sink.

In one preferred embodiment, the LTCC tape is a "white" tape used in the formation of a LED module for use as a HB LED backlight.

DETAILED DESCRIPTION OF THE INVENTION

Figure 1A:
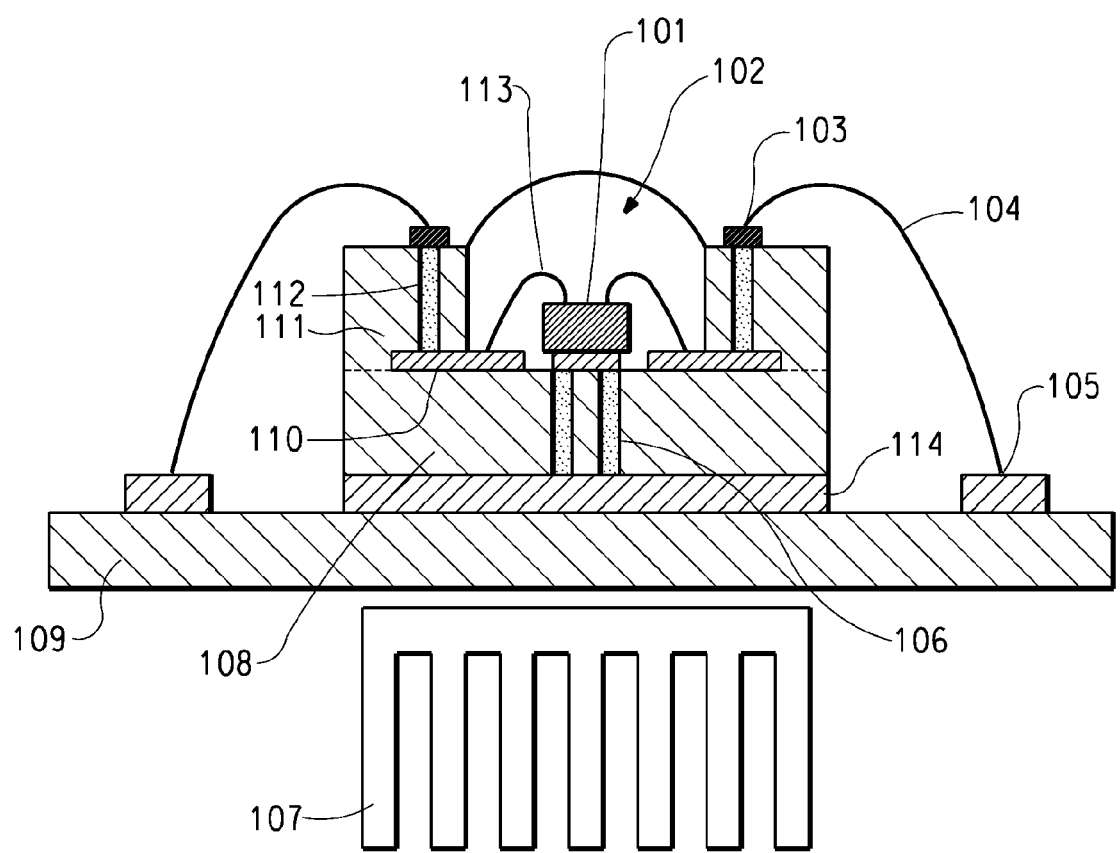
FIG. 1 provides schematic diagrams of chip carrier design with wire bonding.

The present invention provides LTCC (low temperature co-fired ceramic) tape compositions and demonstrates the use of said LTCC tape(s) in the formation of Light-Emitting Diode (LED) chip carriers and modules for various lighting applications. The present invention also provides for the use of LTCC tape and LED modules in the formation of lighting devices including, but not limited to, LED devices, HB LED backlights, display-related light sources, automotive lighting, decorative lighting, signage and advertisement lighting, and information display lighting.

This invention further relates to the material compositions and fabrication processes of chip carriers for HB LED backlight applications wherein a co-fireable LTCC with built-in cavity provides the base to mount one (white, Red, Green, or Blue) or a multiplicity of at least three (Red, Green, and Blue) LED chips or at least four (a combination among white, Red, Green and Blue) LED chips. The said LTCC structure also provides thermal vias which effectively dissipate the heat released from all functioning chips through their connections to heat sink (a heat sink can be a metal core printed circuit motherboard (MCPCB)). The bonding to heat sink can be provided by braze, solder, or other thermally conductive glue. Un-pigmented white color tape compositions with a variety of white color ceramic fillers are to provide mechanical strength and light reflection suitable for the HB LED chip carrier package applications. In the cases where specific color enhancement is needed, a variety of inorganic colored pigment is added to the tape compositions to be used as the LTCC materials. A family of co-fireable silver, copper, gold, silver/platinum, silver/palladium thick film compositions are to provide various functions including but not limited to circuit connections, via fill connections, thermal vias, and light reflection for the HB LED chip carrier package applications.

While the present invention is described by referring to HB LED applications, it is understood that various embodiments may be used in a multitude of lighting applications. The present invention further provides for novel lighting devices including: (1) thin and lightweight message displays, such as public information signs at airports, train stations, and other places; (2) status indicators, such as on/off lights on professional instruments and consumers audio/video equipment; (3) infrared LEDs in remote controls for TVs, DVDs, and VCRs; (4) clusters in traffic signals to replace ordinary light bulbs behind colored glass; (5) car indicator lights; (6) bicycle lighting; (7) calculator and measurement instrument displays; (8) red or yellow LEDs for indicator and alpha numeric displays in environments where night vision must be retained, such as in aircraft cockpits, submarine and ship bridges, astronomy observatories, and in the fields such as night time animal watching and military field use; (9) red or yellow LEDs in photographic darkrooms to provide lighting which doesn't result in unwanted exposure of films; (10) illuminations such as flashlights or torches; (11) emergency or signaling beacons and strobes; (12) movement sensors for mechanical and optical computer mice and trackballs; (13) high-end LED printers; and (14) general household illuminations.

Although some of the above applications can be derived by LEDs of smaller wattage and lower brightness, this invention provides the means to use fewer LED lighting modules to provide equivalent or superior lighting performance, while further simplifying the fabrication process and reducing the cost.

For the purpose of this invention, HB LED packages are referred to as having luminous efficacy of greater or equal to 15 lumens per watt wherein these LEDs are normally associated with a power rating of equal of greater than 0.5 watt with a preferred rating of equal or greater than 1 watt.

This invention discloses cost-effective and simplified fabrication methods to provide a monolithic glass-ceramic chip carrier for one (white, Red, Green, or Blue) or a multiplicity of at least three (White, Red, Green, and Blue) LED chips with either a built-in circuit driver or a connection to an external circuit driver while providing passage ways for heat dissipation.

It is noted that some specific combinations of LED chip and any associated optical materials are needed to provide white light from a single chip set or module. For the purpose of this invention and throughout the text and claims, "White LED chip" is used to represent these types of specific LED chip and optical material combinations, so long as they produce white light. For example, most white LEDs in production today use a 450-470 nm blue Gallium Nitride (GaN) LED covered by a yellowish phosphor coating usually made of Cerium-doped yttrium Aluminum garnet (YAG:Ce) crystals. The single crystal form of YAG:Ce is considered as a scintillator rather than a phosphor. Since yellow light stimulates the red and green receptors of the human eyes, the resulting mix of blue and yellow light gives the appearance of white. White LEDs can also be made by coating near UV emitting LEDs with a mixture of high efficiency Europium based red and blue emitting phosphors plus green emitting copper and aluminum doped zinc sulfide (ZnS:Cu,Al). Another option to produce white light LEDs uses no phosphors and is based on homoepitaxially grown Zinc Selenide (ZnSe) on a ZnSe substrate which simultaneously emits blue lights from its active region and yellow from the substrate. Although a white light is normally applied as a LCD (Liquid Crystal Display) backlight, regardless of whether the light is coming from an aforementioned single chip set or a combination of Red, Green, and Blue LED's, the LTCC chip carrier package of this invention can also provide various colored light with its color enhancement and durability contributed by and not limited to the use of various types of inorganic pigments and an effective heat dissipation as discussed further in the text.

In this invention, the thermal vias directing the heat dissipation are brazed to at least one heat sink making the assembly a single piece of structure which can provide the needed functions as a HB LED package device. Furthermore, this invention provides a family of co-fireable silver and copper thick film compositions which provide various functions including but not limited to circuit connections, via fill connections, thermal vias, and light reflection for the HB LED package applications.

Figure 1B:
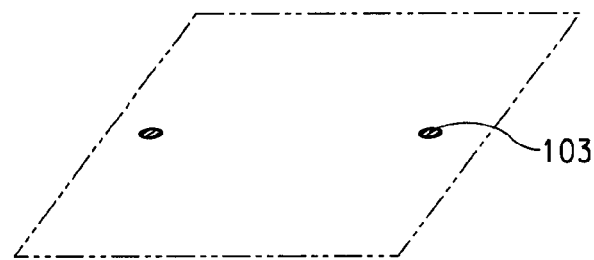
Figure 1C:
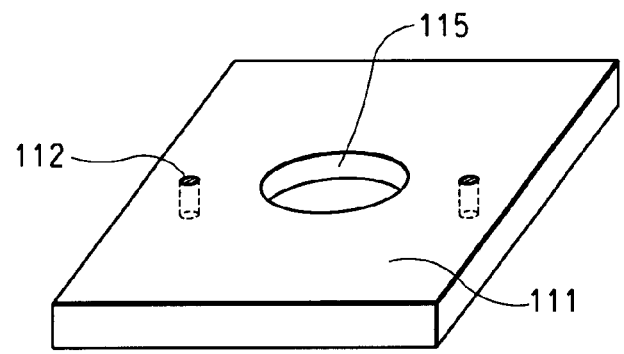
Figure 1D:
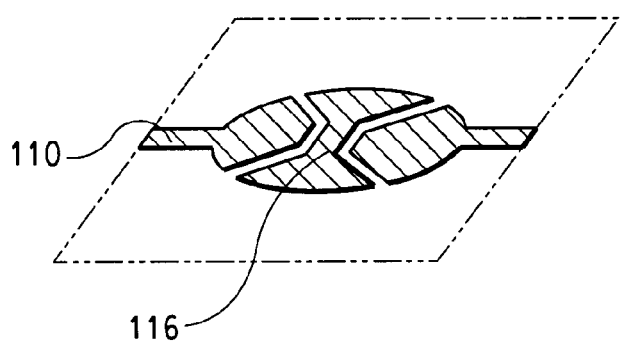
Figure 1E:
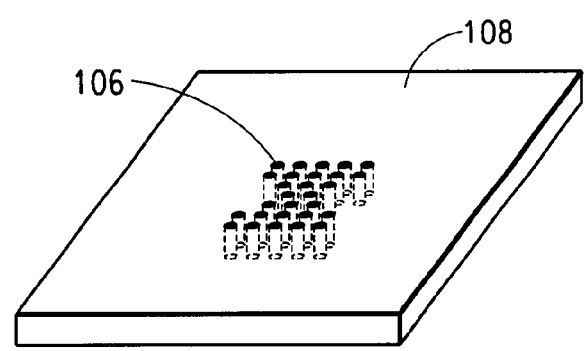
Figure 1F:
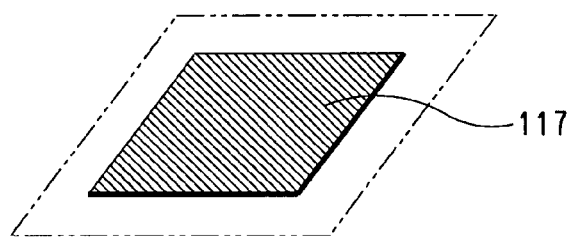

FIGS. 1A through 1F are the schematic diagrams of chip carrier design with wire bonding with the following details: FIG. 1A is a cross-sectional view of a chip carrier with wire bonding. The LTCC chip carrier is shown with a cavity surround on four sides by top tier LTCC dielectric 111. One LED chip is mounted at the center of the cavity with thermal vias 106 resided in the second tier LTCC dielectric 108. Co-fireable conductor provides terminations 103 (top tier), 110 (second tier), external termination 105 on motherboard 109, and heat spreader 114. The chip is connected to the second tier termination by wire bonding 113, and further connected to the external termination by wire bonding 104. Termination 110 is connected to termination 103 by vias 112. The chip is encapsulated in epoxy or other organic material 102. For further heat dissipation, a heat sink 107 is provided and various methods can be used to attach the heat sink to the opposite side of circuit board. FIG. 1B displays the terminations 103 which are used as pads for wire bonding. FIG. 1C displays the cavity 115 in the top tier of a multilayer LTCC dielectric 111, with the conductive vias shown as 112. FIG. 1D displays the conductor layout at the bottom of the cavity; conductor patterns 110 at the left and right hand side serve as either cathode or anode for chip connection whereas conductor pattern 116 provides the bonding pad for the chip and its connection to the thermal vias. FIG. 1E displays the second tier of a multilayer LTCC dielectric 108 with a typical arrangement of thermal vias 106. FIG. 1F displays a heat spreader 117 at the bottom of the thermal vias.

Figure 2A:
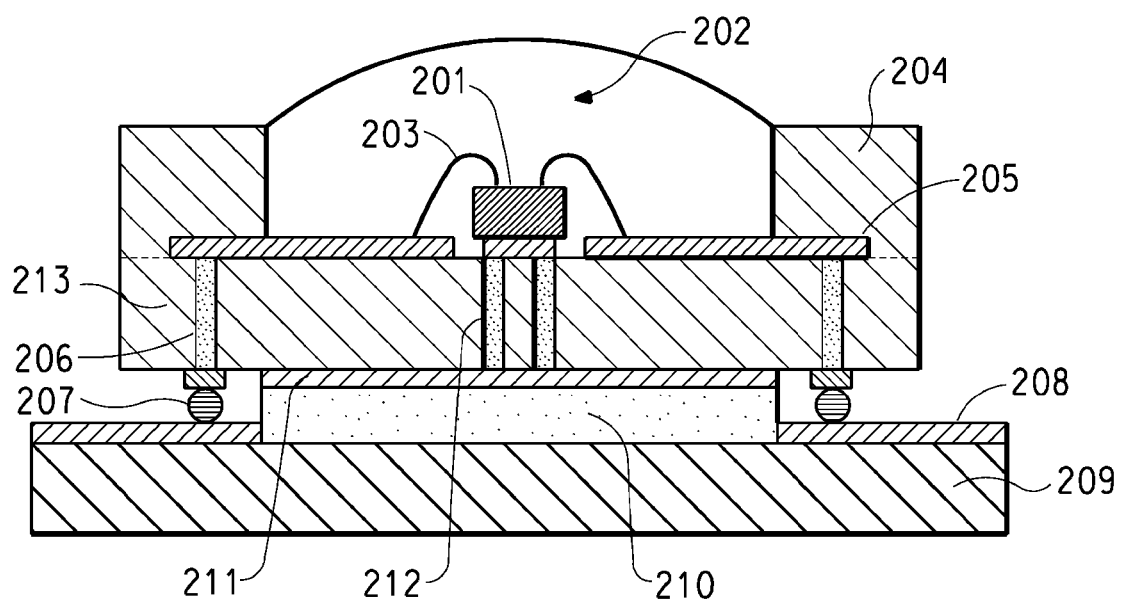
FIG. 2 represents a schematic diagram of the chip carrier design with wire bonding and solder attachment.
Figure 2B:
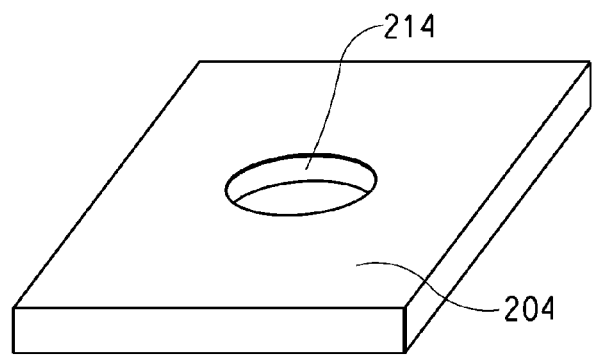
Figure 2C:
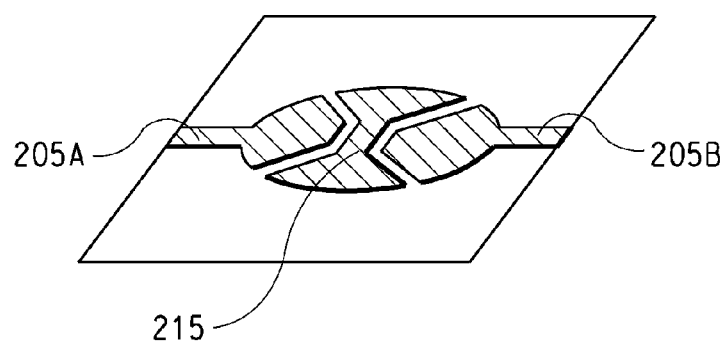
Figure 2D:
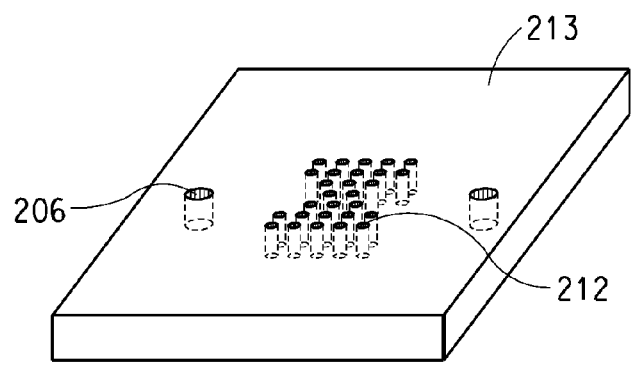
Figure 2E:
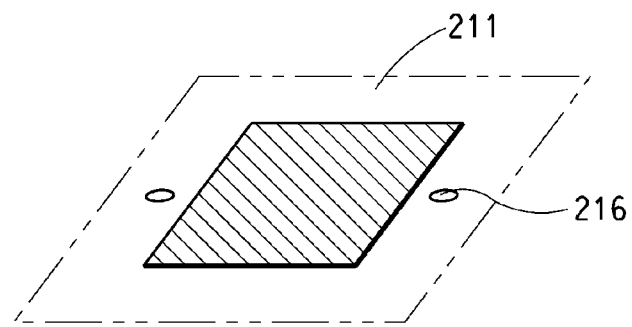

FIGS. 2A through 2E are the schematic diagrams of the chip carrier design with wire bonding and solder attachment with the following details: FIG. 2A is a cross-sectional view of a chip carrier with wire bonding and soldering. A chip is mounted on the second tier 213 of the multilayer LTCC dielectric, wherein wire bonding 203 is used to connect the chip to electrodes 205 (including both cathode and anode) which in turn are connected through conductive vias 206 and solder 207 to the external circuitry 208 deposited on a motherboard 209. Furthermore, thermal vias 212 underneath the chip are connected to a heat spreader 211 which is brazed to a motherboard 209. It is noted that the braze joint 210 can be substituted by solder joint or a connection made with a conductive adhesive. FIG. 2B displays the top tier of the multilayer LTCC dielectric 204 with a cavity 214. FIG. 2C displays both cathode 205A and anode 205B at the left and right side, whereas conductor pattern 215 provides the bonding pad for the chip and its connection to the thermal vias. FIG. 2D displays the second tier of a multilayer LTCC dielectric 213 with a typical arrangement of thermal vias 212. Two conductive vias 206 are displayed to indicate the electrical connection path. FIG. 2E displays a heat spreader 211 at the bottom of the thermal vias 212 with via capture pads 216 which are soldered to the external circuit 208 on the motherboard.

Figure 3A:
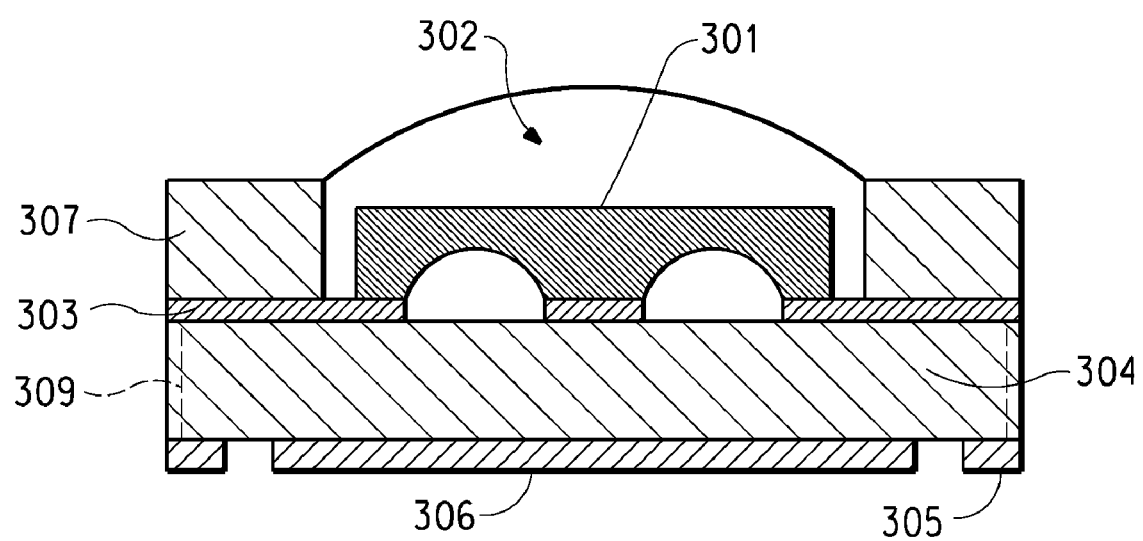
FIG. 3 provides a schematic diagram of the chip carrier design with LED flip chip attachment.
Figure 3B:
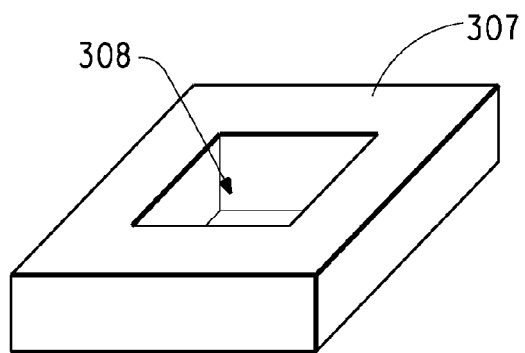
Figure 3C:
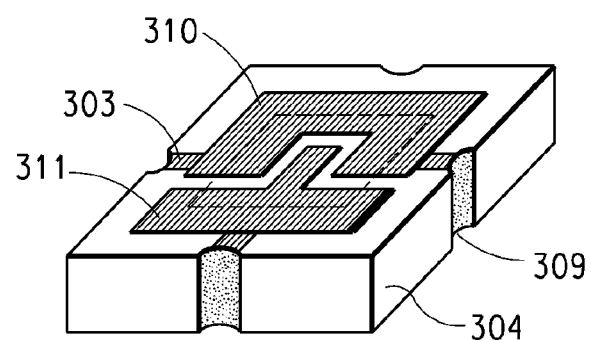
Figure 3D:
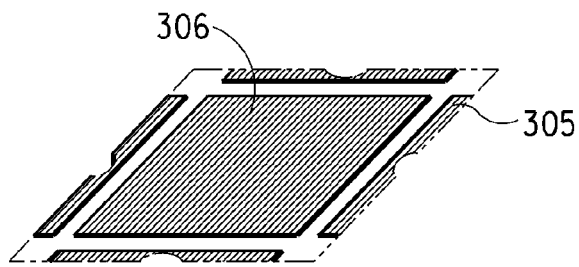

FIGS. 3A through 3D are the schematic diagrams of the chip carrier design with LED flip chip attachment with the following details: FIG. 3A is a cross-sectional view of chip carrier wherein a LED flip chip 301 bonding is applied. A cavity is formed in the top tier of the multilayer LTCC dielectric 307 and electrode patterns are located on the surface of the cavity or in between the top tier 307 and the second tier 304 of the multilayer LTCC dielectric. Additional electrode patterns are located on the bottom surface of the second tier wherein electrode 305 is connected to the electrode 303 through the castellation via 309. FIG. 3B displays the top tier 307 of the multilayer LTCC dielectric with a square cavity 308. FIG. 3C displays electrode patterns 310 and 311 representing anode and cathode or vice versa. The connection is made by a conductive path 303 and a castellation via 309. The location of chip mount is depicted with a dash line border. FIG. 3D displays the back side of FIG. 3C wherein four conductive patterns 305 are connected with castellation vias 309. Furthermore, a heat spreader 306 is patterned at the center.

Figure 4:
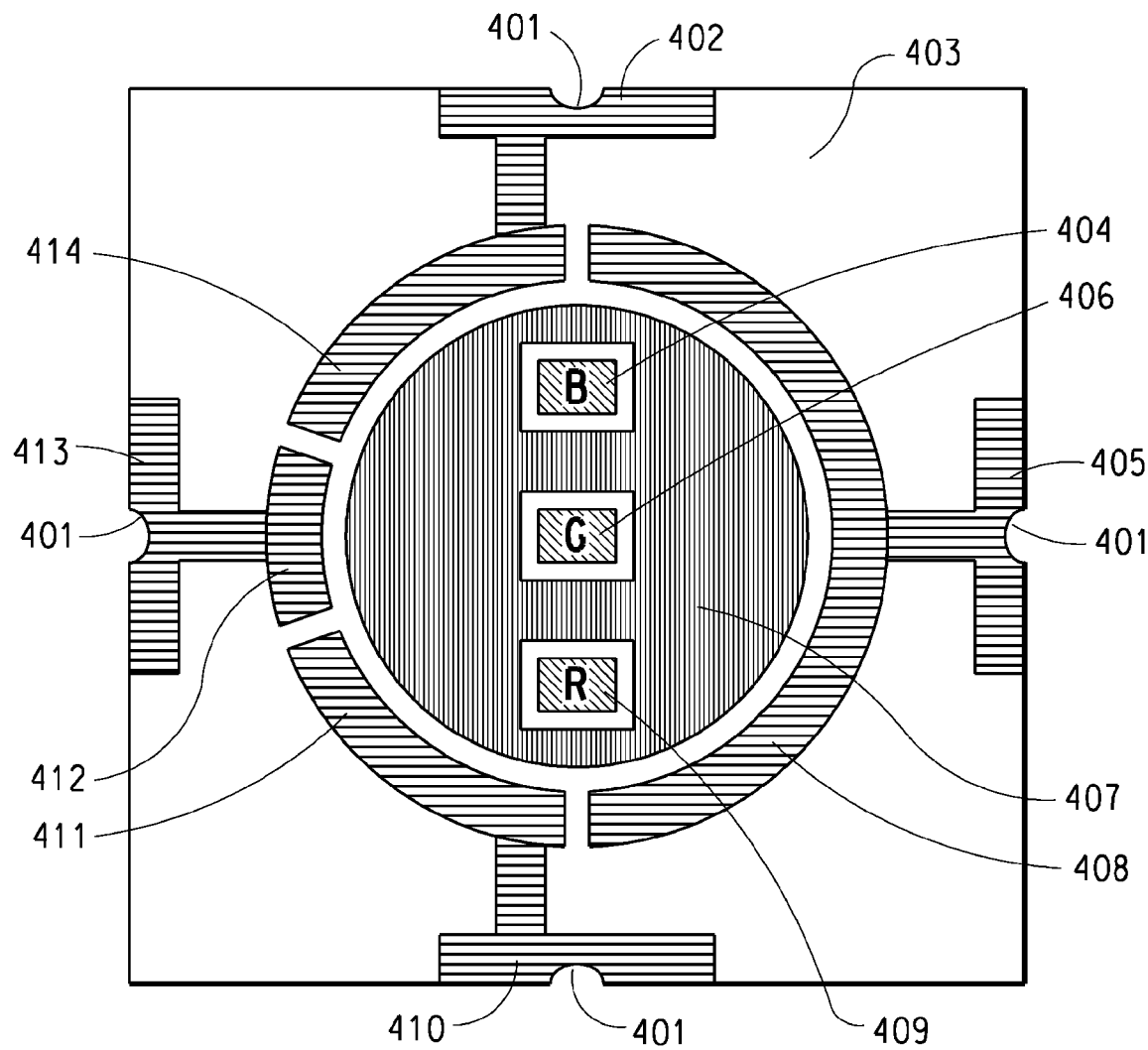
FIG. 4 provides a schematic diagram of the LED placement at the cavity of the chip carrier.

FIG. 4 is a schematic diagram of the LED placement at the cavity of a chip carrier wherein three LED chips, Red (R) 109, Green (G) 106, and Blue (B) 104 are placed on a thermal spreader pad 107 and connected to a common cathode 105. The R, G, and B chips are further connected to the anodes, respectively, 111, 112, and 114. The respective connecting conductor patterns 110, 113, and 102 on this surface are connected to the circuitry at other locations including different LTCC tape layer by castellation vias 101.

Figure 5A:
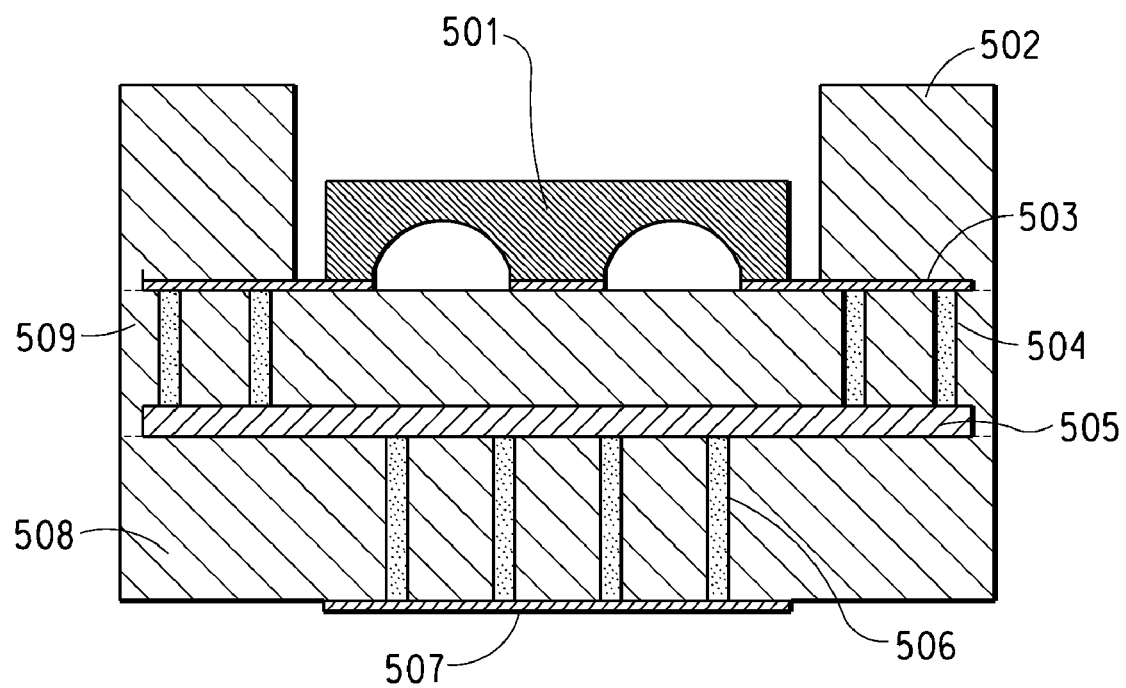
FIG. 5 provides a schematic diagram of the chip carrier with LED flip chip attachment and thermal vias.
Figure 5B:
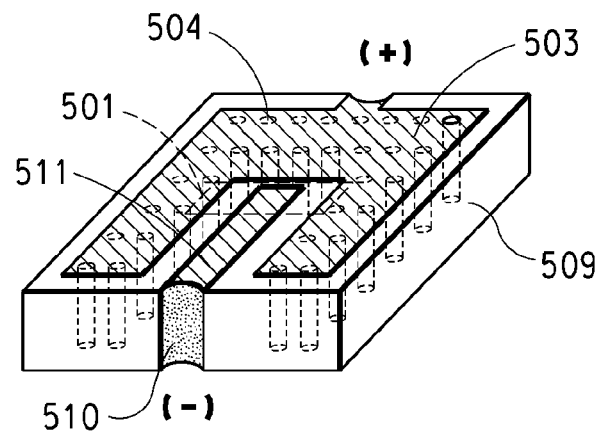
Figure 5C:
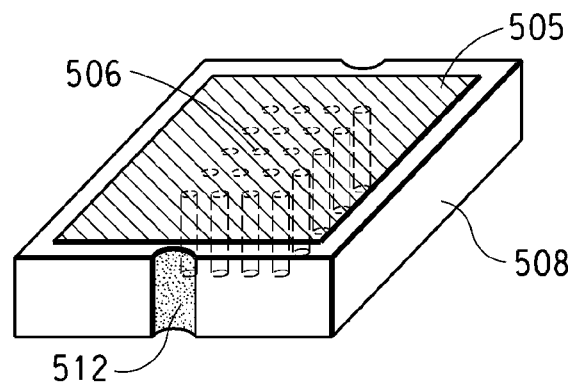
Figure 5D:
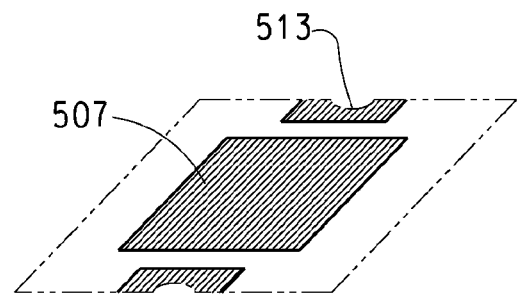

FIGS. 5A through 5D are the schematic diagrams of a chip carrier with flip chip attachment and thermal vias with the following details: FIG. 5A is a cross-sectional view of a chip carrier wherein a flip chip 501 is bonded to a cathode 503 and an anode 511 electrode as shown in FIG. 5B. The cavity is created in the top tier of the multilayer LTCC dielectric 502. The heat dissipation is provided by (1) the thermal vias 504 in the second tier of the multilayer LTCC dielectric 509, (2) a heat spreader 505, (3) the thermal vias 506 in the third tier of the multilayer LTCC dielectric 508, and (4) a heat spreader 507. FIG. 5B displays the second tier 509 of the multilayer LTCC dielectric wherein the larger area conductive pattern presents a cathode 503 with an array of thermal vias 504. The anode 511 is connected to the external circuitry through a castellation via 510. The location of chip mount is depicted with a dash line border at the center stage of 509. FIG. 5C displays the third tier of the multilayer LTCC dielectric 508 with a heat spreader 505. An array of thermal vias 506 is also created for heat dissipation. Castellation vias 512 are also used to connect the anode to the external circuitry. FIG. 5D displays the bottom side of the body 508 wherein a central heat spreader 507 is used to connect the thermal vias to the heat sink by brazing wherein the conductive pads 513 are used to make the connection to the motherboard.

Figure 6:
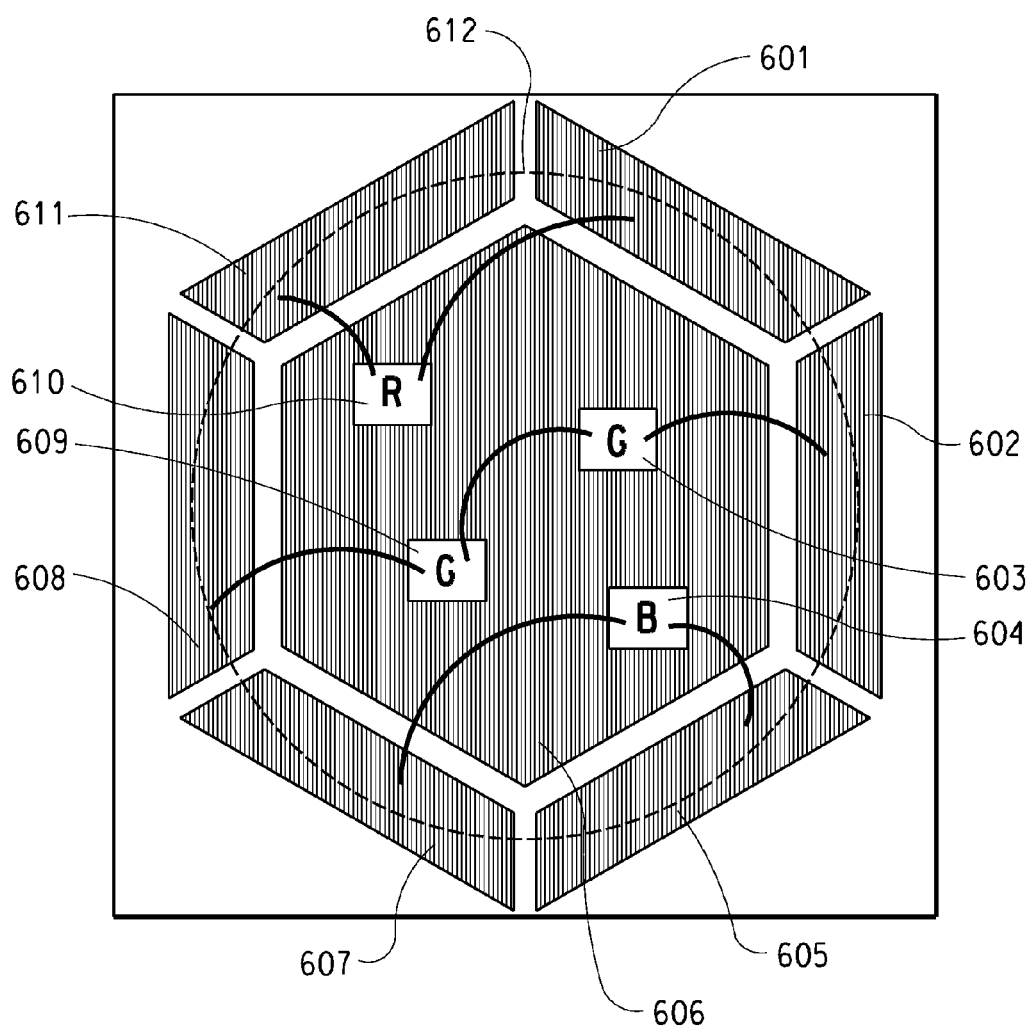
FIG. 6 details placement of four LED chips at the cavity of the chip carrier.

FIG. 6 displays the placement of four LED chips at the cavity surface 606 of a chip carrier. More specifically, two Green (G) 603 and 609, one Red (R) 610, and one Blue (B) 604 LED chips are placed inside the hexagonal conductor layout. Both of the G chips are connected to the common anode 602, and cathode 608. The R chip is connected to anode 601 and cathode 611. The B chip is connected to anode 605 and cathode 607. A circular area depicted by the dashed line 612 represents the location of cavity for LED chip mount.

Figure 7A:
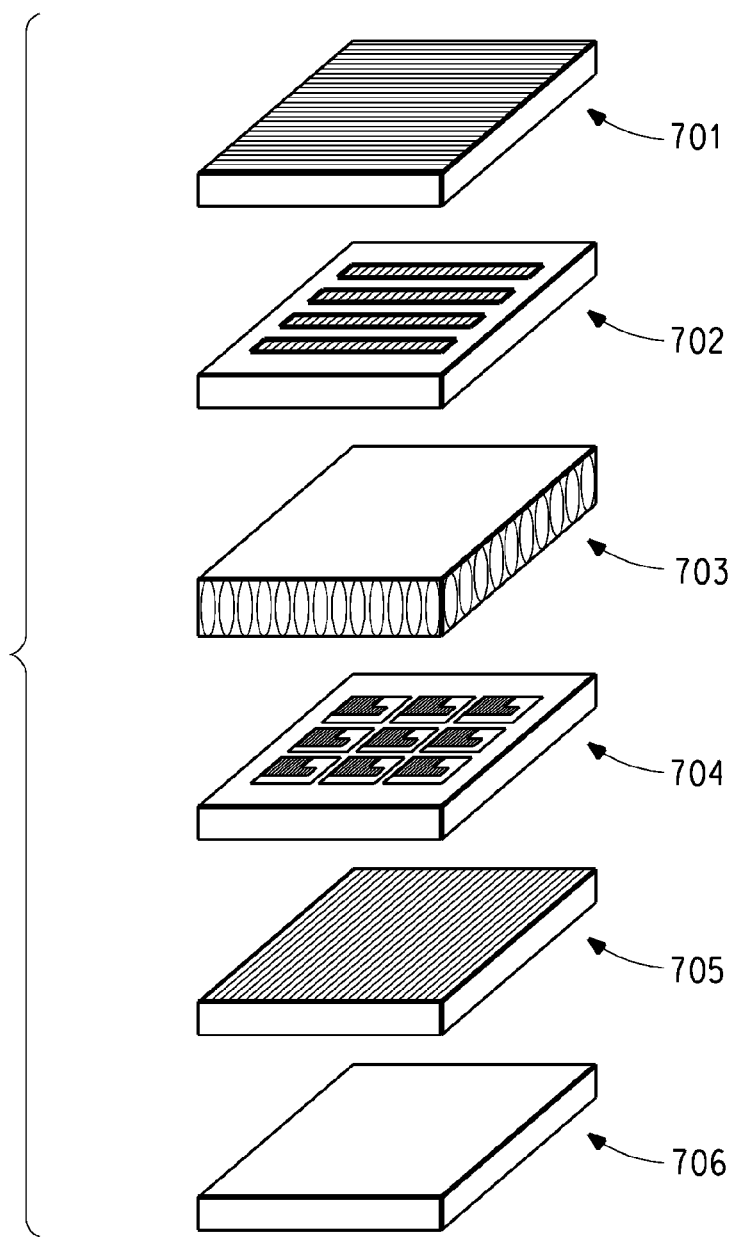
FIG. 7 details a typical prior art LCD structure.
Figure 7B:
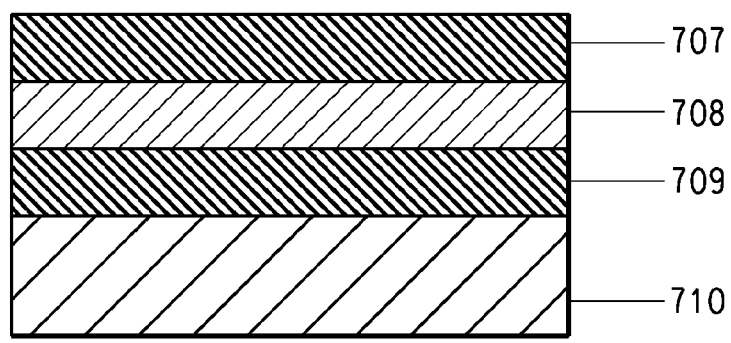

To illustrate the application of this invention as an improved backlight unit on LCD, a description of LCD structure is provided herein. A drawing of typical LCD stack is provided in FIG. 7A comprising six major components. These major components together with their respective elements located in sequence from the LCD viewing side are: (1) a front polarizer stack 701 comprising an anti-reflectance or anti-glare film, a viewing angle film, and a front polarizer; (2) a color filter 702 comprising a front glass, a black matrix/color filter, a common electrode, and an alignment layer; (3) a liquid crystal layer 703; (4) a TFT, thin film transistor array 704 comprising an alignment layer, a display electrode, and a rear glass; (5) a rear polarizer stack 705 comprising a rear polarizer, and a recirculating polarizer of DBEF, dual brightness enhancement film; and (6) a backlight unit 706. The backlight unit 706, illustrate in FIG. 7B is further comprised of a front diffuser 707, at least one layer of prism sheet of BEF, brightness enhancement film 708, a rear diffuser 709 and a lamp and light guide 710. A black reflector is normally provided in 710 to enhance the brightness of the lamp.

The current invention provides a superior alternative to the lamp by the use of a LED lighting module made with a LTCC chip carrier wherein at least one HB LED chip is mounted and its circuit integration and heat dissipation are provided respectively by thick film conductor, electrical via, and thermal via materials. This provides the benefits of stable and improved lighting performance, simplicity of fabrication of backlight units, reliability of lighting performance in the life of LCD, and overall cost.

Although the above description constitutes an embodiment of LED lighting module for LCD backlight application, it is noted that the said application is not limited to LCD. White or colored LED light applications can be easily performed by those skilled in the art with the current invention. It is understood that the LED module of the present invention may comprise red, green, blue, white, yellow or other pigment colors, depending upon the anticipated application. Several examples are given below.

Two material and technology groups, LTCC glass-ceramic dielectric tape compositions and thick film conductor compositions, are essential to realize this invention. Therefore, the two following sections are devoted to provide detailed descriptions of the LTCC dielectric tape compositions and thick film conductor compositions of this invention.

LTCC Glass-Ceramic Dielectric Tape Composition(s)

The tape composition(s) of the present invention comprise glass, ceramic filler, and in a preferred embodiment, inorganic pigment. In one embodiment, the tape composition comprises at least one glass frit, at least one white color refractory inorganic oxide, and/or other inorganic pigment, which provides the white color enhancement and/or reflection. It is noted that, if advantageous, a variety of inorganic colored pigment can be used at 0-10 weight % in the total inorganic substances to provide specific color such as Red, Green, or Blue for display color enhancement by the LED chip carrier.

Depending on the preferred color, the weight % content of inorganic pigment may vary. For example, 0.5% (weight percent based on total inorganic materials) of cobalt aluminate can be added in a glass-ceramic with a aluminum oxide refractory filler to provide a sintered ceramic body of blue color. However, it is necessary to use 1.5 to 2.5% of a black pigment, copper chromite spinel, ShepherdColor's 20C980 to show a sufficiently black color. For the purpose of this invention, for almost all of the colors except black, a predetermined color of the LTCC chip carrier can normally be provided with 0.1 to 10.0 weight % of the corresponding pigment in a ceramic slurry composition comprising frit and refractory filler such as aluminum oxide, and preferably with 0.5 to 1.0% of a given inorganic pigment in the first embodiment. Higher weight % content of pigment normally provide stronger color, but, the optimum weight % of the pigment content depends on the intrinsic properties of the chosen frit since it should provide proper softening and adequate flow during the process of densification or sintering. Furthermore, an optimum composition including the weight % content of a given inorganic pigment depends on the wetting power of a given molten frit on the surface of a given inorganic pigment, the ability to form a crystalline phase, particle sizes and surface reactivity of the inorganic ingredients, among other factors. To achieve darker color, the second embodiment of the slurry composition requires a higher weight % content of a given inorganic pigment, such as from 1 to 10 weight % preferably in the range of 1 to 4 weight %. One other critical property to consider when optimizing the ceramic slurry composition is the resultant mechanical strength of the fired or sintered LTCC body with flexural strength being the key strength parameter. Because of the strength requirement, one or more inorganic pigment may be used in a given LTCC slurry composition to provide a family of balanced properties but not limited to optical (light reflectivity, predetermined color), mechanical (flexural strength), chemical (resistance to environmental corrosion), and thermal (ability to conduct heat) aspect. For example, a white color LTCC chip carrier to provide a LED lighting module requires adequate strength and white light reflectivity. Titanium dioxide, especially in the tetragonal crystalline form of rutile, has a refractive index of 2.9 and is among the top candidates to provide the required optical performance. However, titanium dioxide's flexural strength is about 140 Mpa, about 50% of aluminum oxide, therefore, a volume % substitution of aluminum oxide by titanium dioxide has to be done to maintain adequate strength of the sintered body. A flexural strength of at least 150 Mpa is preferred. Because the remnant glass phase and microstructure in terms of crystalline phase, size, and grain boundary are all variants affecting the eventual strength of the sintered body, the LTCC slurry composition must be carefully adjusted to achieve the predetermined objective. Furthermore, a second inorganic white pigment, such as zirconium dioxide, can also be added to the slurry composition. Although the refractive index of zirconium dioxide (2.16) is lower than titanium dioxide (2.9 for rutile or 2.49 for anatase form), its potential to enhance mechanical strength provides a significant merit. For example, various types of modified zirconium dioxide or zirconium dioxide added aluminum oxide exhibit superior flexural strength (quoted in parenthesis) as compared to a typical aluminum oxide (280 Mpa). These include and are not limited to yttria (Y2O3) doped tetragonal zirconia polycrystals (y-TZP, 1,000 MPa), ceria (CeO2) doped tetragonal zirconia polycrystals (c-TZP, 350 Mpa), zirconia toughened alumina (ZTA, 500 Mpa), magnesia-partially stabilized zirconia (Mg-PSZ, 800 Mpa), among others.

Commonly available high temperature stable inorganic pigments include but are not limited to Iron Oxide (red) such as Kroma Reds® from Elementis Pigments, Cobalt Chromite Green Spinel (green) such as Shepherdcolor's Green 410, Cobalt Chromite Blue Green Spinel (green) such as Shepherdcolor's Green 201, Cobalt Titanate Green Spinel (green) such as Shepherdcolor's Green 10G663, Chromium Aluminate (green) such as Ferro's CK14002, Chromium Cobalt Zinc (green) such as Ferro's CK14028, Cobalt Aluminate Blue Spinel (blue) such as Shepherdcolor's Blue 10K525, Cobalt Chromite Blue Green spinel (blue) such as Shepherdcolor's Blue 10K579, Cobalt Aluminum Chromite (Blue) such as Ferro's CK15069, Cobalt Aluminum Zinc (blue) such as Ferro's CK15063, Cobalt Silicon (blue) such as Ferro's CK220946, Chrome Antimony Titania Buff Rutile (yellow) such as Shepherdcolor's Yellow 196, Nickel Antimony Titanium Yellow Rutile (yellow) such as Shepherdcolor's Yellow 10P110, . . . etc. Other options of pigments include but not limited to Mason Color's 6410 Canary (yellow), 6450 Praseodymium (yellow), 6204 Victoria Green (green), 6224 Dark Green (green), 6263 Victoria (green), 6264 Victoria (green), 6306 Vivid Blue (blue), 6350 Bright Blue (blue), 6360 Willow (blue), 6389 Sapphire Blue (blue), 6003 Crimson (red), 6004 Crimson (red), 6090 Coral (red), and 6069 Dark Coral (red), . . . among others.

The advantages of using LTCC compositions include, but are not limited to: (1) co-fireability at a range of temperature such as up to 850 to 900° C. with high conductivity materials such as silver, copper, gold, and other alloys such as silver/platinum or silver/palladium; (2) formation of cavity structure to provide the platform for LED chip mounting and condensation of the emitted light, this include single chip or a multiplicity of chips of various display colors; (3) a closer TCE match of LTCC materials to the LED chips, (4) the choice of glass and refractory inorganic oxide which provide mechanical strength suitable for chip carrier application and next level module and package integration by soldering, wire bonding, and other electrical and mechanical attachment method; (5) suitable for multilayer circuit layout to integrate with but not limit to at least one LED driver; (6) suitable for providing electrical vias for circuit connection in an otherwise insulating dielectric materials; (7) suitable for providing thermal conduction vias which are co-fireable with the dielectric materials having superior thermal conductivity than a typical organic printed circuit board substrate; and (8) suitable to be connected with at least one heat sink by braze.

The glasses described herein are produced by conventional glass making techniques. The glasses were prepared in 500-1000 gram quantities. Typically, the ingredients are weighed then mixed in the desired proportions and heated in a bottom-loading furnace to form a melt in platinum alloy crucibles. Heating is conducted to a peak temperature (1300-1600° C.), depending on the glass composition and for a time such that the melt becomes entirely liquid and homogeneous. The glass melts were quenched using a counter rotating stainless steel roller to form a 10-20 mil thick platelet of glass. Alternatively, the glass melt can be quenched by direct draining into a water bath. For crystallizable glass, it is critical to assure a sufficiently high melt temperature to obtain a homogeneous melt and a sufficient cooling to prevent the formation of pre-crystals. It may be necessary to apply water lancing to more effectively quench the glass melt. The resulting glass platelet was then milled to form a powder with its 50% volume distribution set between 1-5 microns. The glass powders were then formulated with filler and organic medium to cast tapes as detailed in the Examples section. The glass compositions shown in Table 1 represent a broad variety of glass chemistry (high amounts of glass former to low amounts of glass former). The glass former oxides are typically small size ions with high chemical coordination numbers such as $SiO_2$, $B_2O_3$, and $P_2O_5$. The remaining oxides represented in the table are considered glass modifiers and intermediates.

Two criteria used to identify the suitable candidate oxide(s) are high refractive index and mechanical strength. A refractive index in the range of 1.5 to 3.5 is preferred. These include but not limit to the following family of materials in a descending order of their corresponding reflective index quoted in parenthesis: titanium oxide (2.64), zinc sulfite (2.37), calcium fluoantimonate (2.20), zirconium oxide (2.16), lead arsenate (2.14), antimony trioxide (2.09), tin oxide (2.04), zirconium silicate (2.00), zinc spinel (1.90), and aluminum oxide (1.62). Among the above, $Al_2O_3$ is the preferred ceramic filler since it reacts with the glass to form an Al-containing crystalline phase. $Al_2O_3$ is very effective in providing high mechanical strength and inertness against detrimental chemical reactions. For example, the flexural strength of $Al_2O_3$ or $TiO_2$ is, respectively, 345 or 140 MPa. Therefore, alumina is chosen as the preferred filler which can be used as the sole refractory ceramic oxide or with at least one of the above oxides to provide color and/or light reflectivity while maintaining a suitable mechanic strength of the chip carrier package.

The above filler or mixtures thereof may be added to the castable compositions used to form the tapes in an amount of 0-50 wt. % based on weight of the solids. Other materials, such as zirconium silicate and barium titanate are also suitable ceramic filler candidates. Depending on the type of filler, different crystalline phases are expected to form after firing. The filler can control dielectric constant and loss over the frequency range. For example, the addition of $BaTiO_3$ can increase the dielectric constant significantly. A broad range of LTCC compositions is applicable.

Another function of the ceramic filler is rheological control of the entire system during firing. The ceramic particles limit flow of the glass by acting as a physical barrier. They also inhibit sintering of the glass and thus facilitate better burnout of the organics. Other fillers, $\alpha$-quartz, $CaZrO_3$, mullite, cordierite, forsterite, zircon, zirconia, $BaTiO_3$, $CaTiO_3$, $MgTiO_3$, $SiO_2$, amorphous silica or mixtures thereof may be used to modify tape performance and characteristics. It is preferred that the filler has at least a bimodal particle size distribution with D50 of the larger size filler in the range of 1.5 and 3 microns and the D50 of the smaller size filler in the range of 0.3 and 0.8 microns.

In the formulation of the tape compositions, the amount of glass relative to the amount of ceramic material is important. A filler range of 30%-60% by weight is considered desirable in that the sufficient densification is achieved. If the filler concentration exceeds 50% by wt., the fired structure may not be sufficiently densified and may be too porous and mechanically weak. Within the desirable glass/filler ratio, it will be apparent that, during firing, the liquid glass phase will become saturated with filler material.

For the purpose of obtaining higher densification of the composition upon firing, it is important that the inorganic solids have small particle sizes. In particular, substantially all of the particles should not exceed 15 μm and preferably not exceed 10 μm. Subject to these maximum size limitations, it is preferred that at least 50% of the particles, both glass and ceramic filler, be greater than 1 μm and less than 6 μm.

The organic medium in which the glass and ceramic inorganic solids are dispersed is comprised of a polymeric binder which is dissolved in a volatile organic solvent and, optionally, other dissolved materials such as plasticizers, release agents, dispersing agents, stripping agents, antifoaming agents, stabilizing agents and wetting agents.

To obtain better binding efficiency, it is preferred to use at least 5% wt. polymer binder for 90% wt. solids, which includes glass and ceramic filler, based on total composition. However, it is more preferred to use no more than 30% wt. polymer binder and other low volatility modifiers such as plasticizer and a minimum of 70% inorganic solids. Within these limits, it is desirable to use the least possible amount of polymer binder and other low volatility organic modifiers, in order to reduce the amount of organics which must be removed by pyrolysis, and to obtain better particle packing which facilitates full densification upon firing.

Various polymeric materials have been employed as the binder for green tapes, e.g., poly(vinyl butyral), poly(vinyl acetate), poly(vinyl alcohol), cellulosic polymers such as methyl cellulose, ethyl cellulose, hydroxyethyl cellulose, methylhydroxyethyl cellulose, atactic polypropylene, polyethylene, silicon polymers such as poly(methyl siloxane), poly(methylphenyl siloxane), polystyrene, butadiene/styrene copolymer, polystyrene, poly(vinyl pyrollidone), polyamides, high molecular weight polyethers, copolymers of ethylene oxide and propylene oxide, polyacrylamides, and various acrylic polymers such as sodium polyacrylate, poly (lower alkyl acrylates), poly(lower alkyl methacrylates) and various copolymers and multipolymers of lower alkyl acrylates and methacrylates. Copolymers of ethyl methacrylate and methyl acrylate and terpolymers of ethyl acrylate, methyl methacrylate and methacrylic acid have been previously used as binders for slip casting materials.

U.S. Pat. No. 4,536,535 to Usala, issued Aug. 20, 1985, incorporated herein by reference, has disclosed an organic binder which is a mixture of compatible multipolymers of 0-100% wt. $C_{1-8}$ alkyl methacrylate, 100-0% wt. $C_{1-8}$ alkyl acrylate and 0-5% wt. ethylenically unsaturated carboxylic acid of amine. Because the above polymers can be used in minimum quantity with a maximum quantity of dielectric solids, they are preferably selected to produce the dielectric compositions of this invention.

Frequently, the polymeric binder will also contain a small amount, relative to the binder polymer, of a plasticizer that serves to lower the glass transition temperature (Tg) of the binder polymer. The choice of plasticizers is determined by the polymer that needs to be modified. Among the plasticizers that have been used in various binder systems are diethyl phthalate, dibutyl phthalate, dioctyl phthalate, butyl benzyl phthalate, alkyl phosphates, polyalkylene glycols, glycerol, poly(ethylene oxides), hydroxyethylated alkyl phenol, dialkyldithiophosphonate, polypropylene glycol dibenzoate and poly(isobutylene). Of these, butyl benzyl phthalate is most frequently used in acrylic polymer systems because it can be used effectively in relatively small concentrations. The plasticizer is used to prevent tape cracking and provide wider latitude of as-coated tape handling ability, such as blanking, printing, and lamination. A preferable plasticizer is BENZOFLEX® 400 manufactured by Rohm and Haas Co., which is a polypropylene glycol dibenzoate.

The solvent component of the casting solution is chosen so as to obtain complete dissolution of the polymer and sufficiently high volatility to enable the solvent to be evaporated from the dispersion by the application of relatively low levels of heat at atmospheric pressure. In addition, the solvent must boil well below the boiling point or the decomposition temperature of any other additives contained in the organic medium. Thus, solvents having atmospheric boiling points below 150° C. are used most frequently. Such solvents include acetone, xylene, methanol, ethanol, isopropanol, methyl ethyl ketone, ethyl acetate, 1,1,1-trichloroethane, tetrachloroethylene, amyl acetate, 2,2,4-triethyl pentanediol-1,3-monoisobutyrate, toluene, methylene chloride and fluorocarbons. Individual solvents mentioned above may not completely dissolve the binder polymers. Yet, when blended with other solvent(s), they function satisfactorily. A particularly preferred solvent is ethyl acetate since it avoids the use of environmentally hazardous chlorocarbons.

Application

A green tape for this invention is formed by casting a thin layer of a slurry dispersion of the glass, ceramic filler, polymeric binder and solvent(s) as described above onto a flexible substrate, heating the cast layer to remove the volatile solvent. There is no limitation of the green tape thickness so long as adequate drying of either volatile organic solvent(s) or water (in case of a water based organic binder system) can be achieved during the tape coating process. A preferable thickness range is between 5 and 30 mils, the lower limit is to provide sufficient green strength for ease of handling and the upper limit is to provide adequate drying of the solvent during tape casting. Furthermore, it is noted that the use of thicker tape minimizes the processing step whereas the use of thinner tape permits a higher degree of circuit integration within the dimensional requirements of the chip carrier. It is also noted that the solid content and viscosity of a slip are to be adjusted to coat LTCC tape of various "green" thickness, with extra care to be taken when the tape thickness exceeds 15 mils to assure proper drying of volatile solvent(s). The tape is then blanked into sheets or collected in a roll form. The green tape is typically used as a dielectric or insulating material for multilayer electronic circuits.

According to the defined configuration of the laminate, the selected tapes are blanked with corner registration holes into sheets of dimensions ranging from 3"×3" to 6"×6" or larger sizes. These green tape sheets are typically used as the dielectric or insulating material for multilayer electronic circuits. To connect various layers of the multilayer circuit, via holes are formed in the green tape. This is typically done by mechanical punching. However, a sharply focused laser can also be used to volatilize the organic substance and form via holes in the green tape. Typical via hole sizes for electrical circuit connection range from 0.004" to 0.25", and typical via hole sizes for heat dissipation range from 0.010" to 0.050" wherein circular via holes are normally applied. It is noted that this invention also extends to via holes of other than circular shape according to the preferred design of the chip carrier structure and dimension. The interconnections between layers are formed by filling the via holes with a thick film conductive composition. This composition is usually applied by screen printing, stencil printing, or bladder filling. Each layer of circuitry is completed by screen printing conductor tracks. Also, when other circuit function and integration is needed, resistor compositions or high dielectric constant compositions may be printed on selected layer(s) to form resistive or capacitive circuit elements. Furthermore, specially formulated high dielectric constant green tapes similar to those used in the multilayer capacitor industry can be incorporated as part of the multilayer circuitry. After each layer of the circuit is completed, the individual layers are collated and laminated. A confined uniaxial or isostatic pressing die is used to insure precise alignment between layers. Firing is carried out in a standard thick film conveyor belt furnace or in a box furnace with a programmed heating cycle. This method will, also, allow top or bottom conductors to be co-fired as part of the sintered LTCC structure. The parts were then evaluated for structural integrity and fired dimension against the specifications of chip carriers.

As used herein, the term "firing" means heating the assemblage in an oxidizing atmosphere such as air to a temperature, and for a time sufficient to pyrolyze (burn-out) all of the organic material in the layers of the assemblage to sinter any glass, metal or dielectric material in the layers and thus densify the entire laminate. In the cases with copper based conductors, the furnace firing atmosphere is to be optimized for adequate organic burnout and conductor and tape sintering. The former process needs oxidizing atmosphere such as air or oxygen doped nitrogen and the later process is normally done in nitrogen with low oxygen content such as 100 ppm or below.

It will be recognized by those skilled in the art that in each of the laminating steps the layers must be accurate in registration so that the vias are properly connected to the appropriate conductive path of the adjacent functional layer.

The term "functional layer" refers to the printed green tape, which has conductive, resistive or capacitive functionality.

Thus, as indicated above, a typical green tape layer may have printed thereon one or more resistor circuits and/or capacitors as well as conductive circuits.

Thick Film Conductor Composition

A typical thick film composition for use in low temperature co-fired ceramic circuits comprises, based on weight percent total thick film composition: (a) 60-90 weight percent finely divided particles selected from noble metals, alloys of noble metals and mixtures thereof; (b) one or more inorganic binders selected from (1) 0.2-20 weight percent of one or more refractory glass compositions, (2) 0.1-5 weight percent of an additional inorganic binder selected from (i) metal oxides of Zn, Mg, Co, Al, Zr, Mn, Ni, Cu, Ta, W. La and other "glass network-modifying" refractory metal oxides, (ii) precursors of metal oxides; (iii) non-oxide borides; (iv)non-oxide suicides; and (v) mixtures thereof, and (3) mixtures thereof; dispersed in (c) 10-30 weight percent organic medium.

A typical multilayer LTCC circuit substrate is fabricated by the use of conductive elements comprising a nonconductive LTCC ceramic substrate having a conductive pattern and connecting or non connecting via-fill conductive pattern affixed thereon formed by printing a pattern of above-described screen-printable and/or stencil-applicable paste and firing the printed and/or laminated LTCCs to effect volatization of the organic medium and liquid phase sintering of the inorganic materials and metallization. Furthermore, the multilayer LTCC circuit substrate fabrication is directed to a process for making conductors alone and/or in conjunction with via-fills comprising: (a) applying patterned thick film of the above-described screen-printable paste to a non conductive ceramic substrate, (b) drying the film at a temperature below 200° C., more commonly at or below 150° C. and (c) firing the dried film to effect liquid phase sintering of the inorganic materials and metallization. For copper based conductor compositions, the co-firing of metallization with LTCC must be performed in an atmosphere such as nitrogen or other reducing atmosphere with or without oxygen doping after the completion of organic burnout which occurs normally at around 450° C. or below. The components of a typical conductor composition are discussed herein below. While specific examples of thick film conductor compositions are identified here, it is understood by those skilled in the art that a multitude of thick film conductors may be used in the present invention depending upon the application and desired properties. Several silver-based inner conductor compositions useful in the present invention include Product Numbers 6142d, 6145, 6148, 6154, 6742 available from E. I. du Pont de Nemours and Company. Several useful via compositions include Product Numbers 6141 and 6151 also available from E. I. du Pont de Nemours and Company.

A. Conductive Material

The finely divided metals used in the invention can be of those selected from noble metal, alloys of noble metals, and mixtures thereof, many of which are commercially available. Furthermore, particle size and morphology of the above-mentioned metal powders should be appropriate in screen-printing and/or stencil-applying over non-fired ceramic tape of thickness between 2 mils to 20 mils and preferably between 2 mils to 10 mils and to the laminating conditions of the composite and to the firing conditions.

Thus the metal powders should be no bigger than 10 um and preferably should be below about 5 um. As a practical matter, the available particle size of the metals is from 0.1 to 10 um for silver or copper, depending on the specific application.

The metal powders can have either flake or non-flake morphology. The non-flake powders can be irregularly shaped or spherical. Such flake silvers have an average surface area of approximately 1 m2/g and solid contents of approximately 99-100% by weight. Non-flake silver powders typically have an average surface area to weight ratio of 0.1-2.0 m2/g and solid contents of approximately 99-100% by weight.

In one embodiment of the present invention spherical metallic powders are utilized. These spherical metallic powders, when packed have a greater particle-to-particle contact versus flake and other shaped powders, which gives rise to a metal-to-metal contact and thus a relatively continuous flow of electrons for conduction when combined with the other components of the present invention. These closely packed metal spherical particles allow for "tetrahedral" and/or "octrahedral" voids, wherein the specific inorganic binders of the present invention, such as metal oxides and/or glasses described below of relatively smaller sizes, may settle and upon processing the inorganic binders soften and hold the structure together in a uniform honeycomb-type structure with superior metal-to-metal contact and more continuous electron flow as compared to prior art compositions. In one embodiment, spherical metallic particles with an average particle size distribution in the range of 1 to 4 microns are preferred. In another embodiment, an average particle size of 2 to 3 microns is preferred. By using a blend of two metallic particles having distinctively different averaged particle size, or likewise, a metallic particle with bimodal particle size distribution, one can obtain a higher packing density leading to effective sintering without significant volumetric shrinkage. Furthermore, a more smooth fired metallized surface can be attained which provides a higher reflectivity of the LED display.

B. Inorganic Glass Binder

The inorganic binders of the present invention are one or more inorganic binders selected from (1) 0.2-20 weight percent in the said paste composition of one or more refractory glass compositions with a logarithmic viscosity in the range of 6-7.6 at the firing temperature of said circuit, (2) 0.1-5 weight percent of an additional inorganic binder selected from (i) metal oxides, (ii) precursors of metal oxides; (iii) non-oxide borides; (iv) non-oxide suicides; and (v) mixtures thereof, and (3) mixtures thereof.

The glass component of the conductor compositions of this invention is a, high-softening point, high viscosity glass at 0.2-20 weight percent level and, preferably, at 1-15 weight percent level.

As used herein, the term high-softening point glass is one having a softening point 600-950° C., preferably, 750-870° C. as measured by the parallel plate viscosity measuring techniques (ASTM method).

Typical examples of glasses can be found from any of the compositions listed in Table 1.

The glasses are prepared by conventional glass-making techniques, by mixing the desired components in the desired proportions and heating the mixture to form a melt. As is well-known in the art, heating is conducted to a peak temperature and for a time such that the melt becomes entirely liquid and homogenous. In the present work the components are premixed in a polyethylene jar with plastic balls and melted in a platinum crucible at 1200-1400° C. The melt is heated at the peak temperature for 1-1.5 hours. The melt is then poured into cold water. The maximum temperature of the water during quenching is kept as low as possible by increasing the volume of water to melt ratio. The crude frit, after separation from water, is freed from residual water by drying in air or displacement of water by rinsing with methanol, or other suitable method. The crude frit is then ball-milled for 6-7 hours in a typical container with refractory lining using alumina grinding media in water or a typical organic solvent such as isopropanol. After discharging the milled slurry from the mill, the excess water or solvent is removed by decantation and the frit powder is hot air-dried. The dried powder is then screened through a 325 mesh screen to remove any large particles.

The two major properties of the frits are: it aids the sintering of the conductive metal particulate matters and minimizes the intermixing of conductor materials with remnant glasses present in the LTCC ceramics.

C. Metal Oxide/Non-oxide Binder

The metal oxides and non-oxides, such as borides and silicides, which are suitable for the practice of the invention are those which are capable of reacting with remnant glasses of the tape and increasing the viscosity of the remnant glasses when the composition of the invention is cofired with the tape, either on the surface or buried. Additionally the binders useful in the present invention should act as "sintering inhibitors" for the metal powders during firing of the system.

Suitable inorganic oxides are those based on $Zn^{2+}$, $Mg^{2+}$, $Co^{2+}$, $Al^{3+}Zr^{4+}$, $Mn^{2+}$, $Ni^{2+}$, $Cu^{2+}$, $Ta^{3+}$, $W^{4+}$, $La^{3+}$ and other "glass network modifying" refractory oxides and complex oxides such as copper bismuth ruthenate, and organometallic compounds such as organotitanate disclosed in U.K. Pat. No. 772,675 and U.S. Pat. No. 4,381,945, incorporated herein, that will decompose into finely divided powders of metal oxides during the firing of the system.

The particle size of the metal oxides or precursors should be appropriate to be used in the said paste composition for screen and/or stencil printing, thus the particle size should be no larger than 15 um and preferably should be below 5 um.

D. Organic Medium

The inorganic components including metal powders, glass binder, and metal oxide or non-oxide binder are typically dispersed into an organic medium by mechanical mixing to form viscous compositions called "pastes" having suitable consistency and rheology for printing. A wide variety of inert liquids can be used as organic medium. The rheological properties of the medium must be such that they lend good application properties to the composition, including: stable dispersion of solids, appropriate viscosity and thixotropy for screen printing, acceptable unfired "green" strength, appropriate wettability of the substrate and the paste solids, a good drying rate, and good firing and burn out properties. The organic medium is typically a solution of polymer(s) in solvent(s). Additionally, a small amount of additives, such as surfactants, may be a part of the organic medium. The most frequently used polymer for this purpose is ethyl cellulose. Other examples of polymers include ethylhydroxyethyl cellulose, wood rosin, mixtures of ethyl cellulose and phenolic resins, polymethacrylates of lower alcohols, and monobutyl ether of ethylene glycol monoacetate can also be used. The most widely used solvents found in thick film compositions are ester alcohols and terpenes such as alpha- or beta-terpineol or mixtures thereof with other solvents such as kerosene, dibutylphthalate, butyl carbitol, butyl carbitol acetate, hexylene glycol and high boiling alcohols and alcohol esters. In addition, volatile liquids for promoting rapid hardening after application on the substrate can be included in the vehicle. Various combinations of these and other solvents are formulated to obtain the viscosity and volatility requirements desired.

The inorganic particles are mixed with an inert liquid medium (vehicle or medium) typically by mechanical mixing (e.g. on a roll mill) to form a paste-like composition having suitable consistency and rheology for screen printing and/or stencil applying. The latter is printed as a "thick film" on LTCC green tapes in the conventional manner. Any inert liquid may be used as the vehicle. Various organic liquids, with or without the thickening and/or stabilizing agents and/or other common additives may be used as the vehicle. The only specific criteria of the vehicle is that it must be chemically compatible to the organics present in the LTCC green tapes. Exemplary of organic liquids which can be used are the aliphatic alcohols, esters of such alcohols, for example, acetates and propionates, terpenes such as pine oil, terpineol and the like, texanol and the like, solutions of resins such as ethyl cellulose in solvents as pine oil, and the monobutyl ether of ethylene glycol monoacetate.

The vehicle may contain volatile liquids to promote fast setting after application to the tape.

The ratio of vehicle to solids in the dispersions can vary considerably and depends upon the manner in which the dispersion is to be applied and the kind of vehicle used and furthermore the use of the conductors are for the conductor lines and/or via-fill conductor connections. Normally to achieve good coverage the dispersions will comprise 60-98% solids and 40-2% organic medium (vehicle). The compositions of the present invention may, of course, be modified by the addition of other materials, which do not affect its beneficial characteristics. Such formulations are well within the skill of the art.

The conductor composition(s) of the present invention is used with the said LTCC glass-ceramic dielectric via the method described herein.

Formulation of Thick Film Compositions (Pastes)

The thick film compositions of the present invention were prepared according to the following general methodology. The inorganic solids are mixed with the organic medium and dispersed with suitable equipment, such as a three-roll mill, to form a suspension, resulting in a composition for which the viscosity will be in the range of 100-200 Pascal-seconds at a shear rate of 4 sec-1 for the line conductor compositions and the corresponding value for via-fill conductors is 1000-5000 Pascal-seconds.

In the examples, which follow, the formulation was carried out in the following manner: The ingredients of the paste, minus about 2-5% of the organic components, were weighed together in a container. The components were then vigorously mixed to form a uniform blend; then the blend was passed through dispersing equipment, such as a three roll mill, to achieve a good dispersion of particles. A Hegman gauge was used to determine the state of dispersion of the particles in the paste. This instrument consists of a channel in a block of steel that is 25 um deep (1 mil) on one end and rams up to 0" (i.e., 0-25 um range) depth at the other end. A blade was used to draw down paste along the length of the channel. Scratches appeared in the channel where agglomerates' diameter was greater than the channel depth. A satisfactory dispersion gave a fourth scratch point of 10-18 um, typically. Fourth scratch measurements of >20 um and half channel measurements of >10 um indicated a poorly dispersed suspension/paste.

Next, the remaining 2-5% of the organic components of the paste was added, and the resin content was adjusted to bring the viscosity of the composition to the desired value.

The composition was then applied to a substrate, in this particular case, to the "green tape". The "green tape" was formed by casting a 1-20 mil, preferably 2-10 mil, thin layer of a slurry dispersion of the glass and ceramic filler fine particulates, polymeric binder(s) and solvent(s) as described in the art of "tape casting" into a flexible substrate, and heating the cast layer to remove the volatile solvent. The tape is blanked into sheets or provided in roll form. This green tape is used as an insulating substrate for multilayer electronic circuits/devices, in place of conventional substrates, such as alumina and other refractory ceramic substrates. The green tape sheet is blanked with registration holes at the four corners, and via holes to connect the different layers of conductors using mechanical punching. The size of via holes varies depending on circuit design and property requirements. The interconnections of circuit between conductor track layers of the tape are typically applied by screen printing the conductive inks in the via holes.

The conductive line compositions of the present invention were applied to a sheet of green tape, by the process of screen printing, to a wet thickness of about 10-30 um and the via holes were filled with respective conductive via compositions.

After each layer of tape is printed with conductor lines and via holes as appropriate to the circuit design, the individual layers are collated, laminated and pressed using uniaxial or isostatic pressing die and techniques as described elsewhere in the art of tape pressing/lamination techniques. It will be recognized by those skilled in the art that in each of the laminating steps the printed tape layers must be accurate in registration so that the vias are properly connected to the appropriate conductive lines of the adjacent functional layer, and in the case of thermal vias, each via will be connected appropriately to the next one.

Firing to effect sintering of the green tape compositions and of the inorganic binder as well as the finely divided particles of metal, is preferably done in a well ventilated belt conveyor furnace or programmed box furnace with a temperature profile that will allow de-polymerization of polymers; and/or burnout of the organic matter at about 300-600° C. a period of maximum temperature of about 800-950° C. lasting about 5-20 minutes, followed by a controlled cool down cycle to prevent over-sintering and crystal growth, unwanted chemical reactions at intermediate temperatures, or substrate/fired ceramic tape fracture from too rapid cool down. The overall firing procedure will preferably extend over a period of between 3.5 to 5 hours, and in certain cases it could take up to 24 hours or more depending on the number of layers of green tapes laminated together and/or the thickness of the green tape layers.

The fired thickness of the conductor can range from about 5 to about 15 um, depending on the percent of solids, the type of screen the composition is printed with, the printer set up, and degree of sintering of the inorganic solids. The thickness of via conductors vary depending on the thickness of the green tape used and degree of sintering of the via composition. In order to avoid two major defects, dimpling and posting of the vias, the selection of viscosity and solid content of the composition is important. In general, increased solid content could result in posting and lower solid content will result in dimpling.

The conductor compositions of this invention can be printed onto the green tapes, or onto other thick films either by using an automated printer or a hand printer in the conventional manner. Preferably, automation screen printing techniques are employed, using 200 to 325 mesh screen with typically 0.5 mil emulsion thickness. Conventional stencil printing techniques are also can be used, particularly for filling the smaller vias of size 4-8 mils.

Specific Consideration on Conductor Compositions for Light Reflection

It is commonly known that a frit-containing surface conductor provides a relatively higher electrical resistivity and a darker appearance. Therefore, for the purpose to provide light reflection, it is necessary to use a glass-free Ag, Au, Cu, or alloyed Ag/Pt or Ag/Pd conductor, with or without oxide binder in order to provide reflection. The choice of conductive powders such as Ag, Au, Cu, Pt, or Pd particle size distribution, packing density optimization are all important factors which contribute to the light reflectivity. Packing density optimization can be achieved by selecting conductor particles of at least one and preferably more than one averaged particle size.

More specifically, a co-fireable silver based thick film conductor composition is deposited onto the surface surrounding the LED chip or chips located at the build-in cavity, such as a silver composition has the following characteristics including but not limited to a) the averaged particle size of silver between 1 and 20 microns and preferably between 1 and 5 microns, b) the silver particles are with or without surface attached agents including but not limited to phosphate ester, fatty acid, and the like.

c) at least one type of silver particles is used in the composition, in the case of two or more silver particles, the choice of candidate silver particles is dependent on their respective particle size distribution for the purpose of minimizing the sintering stress versus the sintering of LTCC dielectric materials;

d) at least one type of silver particles is used in the composition, in the case of two or more silver particles, the choice of candidate silver particles is dependent on their respective particle size distribution for the purpose of minimizing the surface roughness to enhance the light reflectivity of but not limited to a LED backlight module.

If needed, the conductor pads can be further plated to enhance the light reflectivity.

Specific Consideration on Conductors for Thermal Vias

Thermal vias are used to dissipate the heat resulted from a functional LED chip carrier package and this invention is to provide at least to one and preferably a multiplicity of thermal vias to minimize the junction temperature to prolong the life of the HB LED package functions. It is further noted that the thermal vias are normally connected to heat spreader pad which can take the shape and form of a mesh pattern, a solid pattern, or any other suitable geometry.

Increased operational life in multilayered circuit substrates such as the chip carriers of this invention generally can be achieved through a judicious selection of materials and careful thermal-mechanical management and design. Typically, the efforts involve controlling the thermal profile in a populated LTCC (or other materials to produce multilayer circuit substrates) module by the choices of substrate, heat sink, and placement of the heat sink. Substantial reduction in junction temperatures can then be obtained, and the apparent increase in reliability generally suffices for the most if not all electronic applications.

However, in high-speed multichip module design, other complications arise, such as the mixing of chips which may have different thermal dissipation characteristics. In this invention, the use of at least three LED chips, namely G, R, and B, present exactly the aforementioned challenges. A possibly large disparity in junction temperatures alters the switching thresholds of the chips, generates clock skew, and degrades system performance. For cost reasons, higher thermal conductivity materials such as beryllia or aluminum nitride are not viable options to replace alumina. Furthermore, such an option does not completely solve the temperature equalization between chips of mixed technologies. The thermal conduction paths from chip to ambient are still equivalent, and the dissipated power levels are still different. Current practice calls for introducing thermal vias in LTCC to lower thermal impedance. It is to be noted, however, that the junction temperature disparity will still be observed if equal thermal via densities are used. By adjusting the density of thermal vias, variable cooling can be designed within a large range of thermal impedance. Junction temperatures in chips with large power density can thus be balanced. This method makes the best use of the lower thermal conductance of the LTCC dielectric materials and the high thermal conductance of the via fill conductor pastes to produce a wide range of composite thermal impedance. This concept can be extended further to the selective cooling of different regions of a chip. Factors such as the use of heat spreader (i.e. a metallized conductor plane be a solid or gridded geometry) and the ratio of chip bonding area to the available cavity space both affect the thermal conduction performance. It is noted that the maximum chip bonding area equal to the available cavity area provides the best thermal management. However, due to the actual functional consideration, the substrate and cavity dimension are tailored to each chip array and sufficient space is needed to form a good die attached fillet for adequate bonding. In the case of flip chip bonding or BGA attachment, minimum space between the chip and cavity can be adopted so long as adequate electrical insulation between the anode and cathode(s) is achieved. This differs from the use of wire bonding for chip connection which needs more space in between. The effect of introducing thermal spreader will be described further in the following teaching.

LTCC has inherently higher thermal conductivity than organic materials and the thermal conductivity can be improved with the addition of thermal vias and metallized conductor planes. There are two aspects, the thru-plane and the in-plane thermal conductivity to be addressed herein. Testing has shown an improvement in thru-plane conductivity to be 2 times of more than that of the dielectric material conductivity and improvement in in-plane thermal conductivity by 2 to 3 times through the use of thermal vias and metallized planes. While solid metallization planes can be used in LTCC, gridded or meshed planes improve processability and they are as thermally effective as solid planes. It is understood that the highest thru-plane thermal conductivity is obtained in the samples with the greatest possible number of thermal vias. The addition of any solid or gridded conductor planes does not significantly improve the thermal conductivity of a typically lower via density design, such as 12 mil vias on 50, 100, and 150 mil centers. However, the above conductor planes significantly improve the thermal conductivity of a typically higher via density design, such as 8 mil vias on 20, 40, and 60 mil centers.

In a configuration without thermal vias the solid or gridded conductor planes offer no improvement in thru-plane thermal conductivity. The addition of one internal gridded conductor plane improved the in-plane thermal conductivity by about 10 to 20%. Furthermore, gridded planes connecting thru thermal vias improve the in-plane thermal conductivity by about twice that of the configurations without conductor planes.

Brazing Materials and Process

Thick film brazing materials are suitable for large volume manufacturing and the attachment of heat sink to a pre-fired LTCC chip carrier. It is noted that the temperature hierarchy of the HB LED package module requires (1) the co-firing of tape, conductor, electrical via, and thermal via which takes place at highest temperature such as 850 to 900° C., (2) brazing of chip carrier to a heat sink which takes place normally at a medium temperature range between 350° C. and 850° C., depending on the choice of braze materials, (3) chip bonding by flip chip or soldering, (4) gold wire bonding if necessary, and (5) applying plastic encapsulant such as epoxy or other thermal plastic organic materials.

A brazing process normally is consisted of (1) brazing metallization, (2) brazing alloy/filler metal, (3) preparing the surface of joining component—a heat sink in this invention, (4) fixturing, (5) firing in furnace with suitable profile and atmosphere control. Proper thick film brazing compositions normally is consisted of a thick film adhesion layer and a thick film barrier layer. For example, the DuPont thick film brazing materials include Au-based 5062 (adhesion layer), 5063 (barrier layer), and Ag/Pt-based 5081 (adhesion layer) and 5082 (barrier layer). The above thick film compositions provide an interface between LTCC with thermal vias and a heat sink. Depending on the TCE, thermal conductivity, and cost, a variety of heat sink materials are available for the applications of this invention. These include but are not limited to plated alloys of Cu—W, Cu—Mo, Cu—Mo—Cu, and Al—SiC; BeO and AlN are also good candidate materials for heat sink applications. The heat sink may also be Al. Other examples include but are not limited to a metal core printed wiring (MCPWB).

EXAMPLES

Tape compositions used in the examples were prepared by ball milling the fine inorganic powders and binders in a volatile solvent or mixtures thereof. To optimize the lamination, the ability to pattern circuits, the tape burnout properties and the fired microstructure development, the following volume % formulation of slip was found to provide advantages. The formulation of typical slip compositions is also shown in weight percentage, as a practical reference. The inorganic phase is assumed to have a specific density of 4.5 g/cc for glass and 4.0 g/cc for alumina and the organic vehicle is assumed to have a specific density of 1.1 g/cc. The weight % composition changes accordingly when using glass and refractory oxides for light reflection enhancement other than alumina as the specific density maybe different than those assumed in this example. The table 1 lists a variety of lead-containing and lead-free glass compositions suitable for the applications in this invention.

TABLE 1

A List of glass compositions (in wt. %)

| Glass # (density) | $SiO_2$ | $Al_2O_3$ | PbO | $ZrO_2$ | $B_2O_3$ | CaO | BaO | MgO | $Na_2O$ | $Li_2O$ | $P_2O_5$ | $TiO_2$ | $K_2O$ | $Cs_2O$ | $Nd_2O_3$ | SrO |
|---|---|---|---|---|---|---|---|---|---|---|---|---|---|---|---|---|
| 1 (4.72) | | | | | 6.08 | | 23.12 | | | | 4.50 | 34.25 | | | | 32.05 |
| 2 (3.06) | 13.77 | | | 4.70 | 26.10 | | 14.05 | 35.09 | | 1.95 | 4.34 | | | | | |
| 3 (2.66) | 55.00 | 14.00 | | | 9.00 | 17.50 | 4.50 | | | | | | | | | |
| 4 (4.54) | | | | | 11.91 | | 21.24 | | | 0.97 | 4.16 | 26.95 | | 4.59 | 30.16 | |
| 5 (2.80) | 56.50 | 9.10 | 17.20 | | 4.50 | 8.00 | | 0.60 | 2.40 | | | | 1.70 | | | |
| 6 (4.45) | | | | | 11.84 | | 21.12 | | | 1.31 | 4.14 | 25.44 | | 6.16 | 29.99 | |
| 7 (2.52) | 52.00 | 14.00 | | | 8.50 | 17.50 | | 4.75 | 2.00 | 0.25 | | | 1.00 | | | |
| 8 (4.58) | | | | | 6.27 | | 22.79 | | | 0.93 | 4.64 | 33.76 | | | | 31.60 |

TABLE 1-continued

A List of glass compositions (in wt. %)

| Glass # (density) | SiO$_2$ | Al$_2$O$_3$ | PbO | ZrO$_2$ | B$_2$O$_3$ | CaO | BaO | MgO | Na$_2$O | Li$_2$O | P$_2$O$_5$ | TiO$_2$ | K$_2$O | Cs$_2$O | Nd$_2$O$_3$ | SrO |
|---|---|---|---|---|---|---|---|---|---|---|---|---|---|---|---|---|
| 9 (4.56) | | | | | 9.55 | | 21.73 | | | 0.92 | 4.23 | 32.20 | | 1.24 | 30.13 | |
| 10 (4.55) | | | | | 10.19 | | 21.19 | | | 0.97 | 4.15 | 28.83 | | 4.58 | 30.08 | |
| 11 (3.01) | 12.83 | | | 4.65 | 21.72 | | 13.09 | 34.09 | | 1.96 | 11.65 | | | | | |
| 12 (3.01) | 13.80 | | | 4.99 | 25.86 | | 13.45 | 33.60 | | 2.09 | 4.35 | | | 1.87 | | |
| 13 (2.61) | 52.00 | 14.00 | | | 9.00 | 17.50 | | 5.00 | 1.75 | 0.25 | | | 0.50 | | | |
| 14 (2.53) | 53.5 | 13.00 | | | 8.50 | 17.00 | | 1.00 | 2.25 | 0.25 | | | 1.50 | | | 3.00 |
| 15 (3.02) | 13.77 | | | 4.70 | 22.60 | | 14.05 | 35.09 | | 1.95 | 7.84 | | | | | |
| 16 (2.57) | 54.00 | 12.86 | | | 8.41 | 16.82 | | 0.99 | 2.23 | 0.25 | | | 1.48 | | | 2.96 |
| 17 (2.55) | 54.50 | 12.72 | | | 8.32 | 16.63 | | 0.98 | 2.20 | 0.24 | | | 1.47 | | | 2.94 |

Typical Primary and Internal Constraining Tape Compositions:

|  | Volume % | Weight % |
|---|---|---|
| Inorganic phase | 41.9 | 73.8 |
| Organic phase | 58.1 | 26.2 |

The above volume and weight % slip composition may vary dependent on the desirable quantity of the organic solvent and/or solvent blend to obtain an effective slip milling and coating performance. More specifically, the composition for the slip must include sufficient solvent to lower the viscosity to less than 10,000 centipoise; typical viscosity ranges are 1,000 to 8,000 centipoise, depending on the target as-coated tape thickness. An example of a slip composition is provided in Table 2. Depending on the chosen slip viscosity, higher viscosity slip prolongs the dispersion stability for a longer period of time (normally several weeks). A stable dispersion of tape constituents is usually preserved in the as-coated tape.

TABLE 2

Tape Slip Compositions:

| Component | Weight % |
|---|---|
| Acrylate and methacrylate polymers | 4.6 |
| Phthalate type plasticizers | 1.1 |
| Ethyl acetate/isopropyl alcohol mixed solvent | 20.4 |
| Glass powder | 50.7 |
| Alumina powder | 23.2 |

The glasses used in the Examples were melted in Pt/Rh crucibles at 1450-1600° C. for about 1 hour in an electrically heated furnace. Glasses were quenched by metal roller as a preliminary step and then subjected to particle size reduction by milling. The glass particles were adjusted to a 5-7 micron mean size by milling prior to formulation as a slip. Since additional milling was utilized in the fabrication of slip, the final mean size is normally in the range of 1-3 microns. It is noted that the glass particles may also be pre-milled to a final size of 1-3 microns prior to its use as an ingredient in the slip composition.

The percentage reflectance measurements were made using a Varian Cary 5000 uv/vis/nir spectrophotometer with a DRA-2500 diffuse reflectance accessory. The DRA-2500 uses a 150mm integrating sphere coated with Spectralon®. A 100 percent baseline is then collected using Spectralon® reference. The reference is then replaced by the sample and the reflectance spectrum is collected. For the samples included in the following example section, a wavelength range of 800 to 250 was used. Both diffuse and specular components were included in the measurement.

Example 1

A four layer LTCC laminate was prepared using the following materials:

Tape 1, as described above in Table 2 and with the inorganic powder containing 64 volume percent of a glass with the composition in weight percent of glass #5 in Table 1 and 36 volume percent Al$_2$O$_3$. It is noted that the glass #5 contains 17.20 weight % lead oxide. By weight % of the total inorganic composition, glass #5 or alumina is respectively, 55.44%, or 44.56%. It is further noted that inorganic pigments providing white color can also be used to substitute a portion of the alumina, as described in Tape 2 to enhance the light reflectivity of the upper portion of the resultant LTCC chip carrier. The green thickness was 10 mils or 254 micrometers.

After lamination the parts were placed on setters and fired in a conveyer furnace with an air atmosphere where the temperature was increased from room temperature to 850° C. and held for 18 minutes and then allowed to cool back to room temperature the whole process taking approximately 3 hours and 30 minutes. The fired part was fully densified and free from camber.

Example 2

A four layer LTCC laminate was prepared using the following materials:

Tape 2, as described above in Table 2 and with the inorganic powder containing 64 volume percent of a glass with the composition in weight percent of glass #5 and 36 volume percent of Al$_2$O$_3$ and TiO$_2$ at a ratio of 10 to 1. By weight % of the total inorganic composition, glass #5, alumina, or titania, is respectively, 55.44%, 40.10%, or 4.46%. The green thickness was 10 mils or 254 micrometers.

After lamination the parts were placed on setters and fired in a conveyer furnace with an air atmosphere where the temperature was increased from room temperature to 850° C. and held for 18 minutes and then allowed to cool back to room temperature the whole process taking approximately 3 hours and 30 minutes. The fired part was fully densified and free from camber.

Example 3

A four layer LTCC laminate was prepared using the following materials:

Tape 3, as described above in Table 2 and with the inorganic powder containing 68.7 volume percent of a glass with the composition in weight percent of glass #17 and 31.3 volume percent of Al$_2$O$_3$, glass #17, The weight % composition of frit or alumina is respectively, 58.51%, or 41.49%. The green thickness was 10 mils or 254 micrometers.

After lamination the parts were placed on setters and fired in a conveyer furnace with an air atmosphere where the temperature was increased from room temperature to 850° C. and held for 18 minutes and then allowed to cool back to room temperature the whole process taking approximately 3 hours and 30 minutes. The fired part was fully densified and free from camber.

The % light reflection the above blank LTCC substrate at red (650 nm), green (510 nm), or blue (475 nm) light wavelength is, respectively, 82.1%, 81.1 % or 80.9% when measuring the top surface of the fired part with respect to how the substrate was placed on the setter for the furnace firing.

Example 4

A four layer LTCC laminate was prepared using the following materials:

Tape 4, as described above in Table 2 and with the inorganic powder containing 68.7 volume percent of a glass with the composition in weight percent of glass #17 and 31.3 volume percent of $Al_2O_3$ and $TiO_2$ at a ratio of 98 to 2. The weight % composition of frit, alumina, or $TiO_2$ is respectively, 58.51%, 40.63%, or 0.86%. The green thickness was 10 mils or 254 micrometers.

After lamination the parts were placed on setters and fired in a conveyer furnace with an air atmosphere where the temperature was increased from room temperature to 850° C. and held for 18 minutes and then allowed to cool back to room temperature the whole process taking approximately 3 hours and 30 minutes. The fired part was fully densified and free from camber.

The % light reflection the above blank LTCC substrate at red (650 nm), green (510 nm), or blue (475 nm) light wavelength is, respectively, 82.8%, 82.7% or 81.9% when measuring the top surface of the fired part and 82.8%, 82.5%, or 81.6% when measuring the bottom surface of the fired part with respect to how the substrate is placed on the setter for the furnace firing.

Example 5

A four layer LTCC laminate was prepared using the following materials:

Tape 5, as described above in Table 2 and with the inorganic powder containing 68.7 volume percent of a glass with the composition in weight percent of glass #17 and 31.3 volume percent of $Al_2O_3$ and $TiO_2$ at a ratio of 90 to 10. The weight % composition of frit, alumina, or $TiO_2$ is respectively, 58.51%, 37.17%, or 4.32%. The green thickness was 10 mils or 254 micrometers.

After lamination the parts were placed on setters and fired in a conveyer furnace with an air atmosphere where the temperature was increased from room temperature to 850° C. and held for 18 minutes and then allowed to cool back to room temperature the whole process taking approximately 3 hours and 30 minutes. The fired part was fully densified and free from camber.

The % light reflection the above blank LTCC substrate at red (650 nm), green (510 nm), or blue (475 nm) light wavelength is, respectively, 92.5%, 89.6% or 86.7% when measuring the top surface of the fired part and 92.3%, 88.8%, or 84.9% when measuring the bottom surface of the fired part with respect to how the substrate is placed on the setter for the furnace firing.

Example 6

A four layer LTCC laminate was prepared using the following materials:

Tape 6, as described above in Table 2 and with the inorganic powder containing 64 volume percent of a glass with the composition in weight percent of glass #17 and 36 volume percent of $Al_2O_3$ and $TiO_2$ at a ratio of 5 to 1. By weight % of the total inorganic composition, glass #17, alumina, or titania, is respectively, 53.12%, 39.06%, or 7.82%. The green thickness was 10 mils or 254 micrometers.

After lamination the parts were placed on setters and fired in a conveyer furnace with an air atmosphere where the temperature was increased from room temperature to 850° C. and held for 18 minutes and then allowed to cool back to room temperature the whole process taking approximately 3 hours and 30 minutes. The fired part was fully densified and free from camber.

Example 7

A four layer LTCC laminate was prepared using two layers of Tape 1 and two layers of Tape 2 wherein the green thickness of both tapes was 10 mils or 254 micrometers. Tape 2, as described above in Example 2 is consisted of $TiO_2$ which provides light reflection enhancement and was placed as the top two layers of the LTCC laminate.

After lamination the parts were placed on setters and fired in a conveyer furnace with an air atmosphere where the temperature was increased from room temperature to 850° C. and held for 18 minutes and then allowed to cool back to room temperature the whole process taking approximately 3 hours and 30 minutes. The fired part was fully densified and free from camber.

Example 8-14

In the Examples 8-14 that follow, the glass compositions detailed in Table 1 were used. Glasses 2, 5, and 6 represent glasses that are useful in the present invention. It is noted that both lead-containing and lead-free glasses are applicable to be the inorganic binder in the preferred conductor paste compositions.

Conductor compositions: Examples 8-14 represent examples of the present invention. All formulations are given in weight percent of the total thick film composition. Non-flake silver powders represented below have an average surface area to weight ratio of 0.1-2.0 m2/g. Palladium metal powders represented below have an average surface area to weight ratio of 2.0-15.0 m2/g. Platinum metal powders represented below have an average surface area to weight ratio of approximately 10 m2/g to 30 m2/g. The average particle size distribution of the gold metal powders is in the range of 1-4 microns.

Example 8

| Silver Ground Plane & Inner Conductor | |
|---|---|
| Silver powder | 80.6 |
| Frit #2 | 1.2 |
| Organo metallics | 1.0 |

Ethyl cellulose/texanol-based medium represents the balance Silver powder SA 0.1-1.5 m2/gm Example 9

| Silver Palladium Solderable Top Conductor | |
|---|---|
| Silver powder | 53.5 |
| Palladium powder | 13.6 |
| Copper bismuth ruthenate | 5.1 |
| Copper oxide | 0.5 |

Ethylcellulose/terpineol-based medium represents the balance

Flake Silver SA ~0.60-0.90 m2/gm; Tap density 4.0-6.0 g/ml

Example 10

| Silver via fill Conductor | |
| --- | --- |
| Silver Powder | 90.9 |
| Frit #2 | 1.2 |

Ethyl cellulose/texanol-based medium represents the balance

Silver powder SA 0.1-1.5m2/gm

Example 11

| Wire-Bondable/Inner/Ground plane Gold Conductor | |
| --- | --- |
| Gold powder | 80.7 |
| Frit #5 | 0.8 |

Ethyl cellulose/terpineol-based medium represents the balance

Gold powder particle size distribution (PSD) d50~2-3 um

Example 12

| Palladium-Silver Transition via Fill Conductor for mixed metal system | |
| --- | --- |
| Silver Powder | 86.5 |
| Palladium powder | 3.0 |
| Frit # 5 | 0.8 |

Ethyl cellulose/texanol-based medium represents the balance

Palladium powder surface area to weight ratio (SA) ~1.1-1.7 m2/gm

Silver powder SA ~0.1-1.5 m2/gm

Example 13

| Silver-Platinum Platable Conductor | |
| --- | --- |
| Silver Powder | 82.2 |
| Platinum | 2.0 |
| Frit #17 | 0.8 |

Ethyl cellulose/texanol-based medium represents the balance

Palladium powder SA ~1.1-1.7 m2/gm

Platinum Powder SA ~0.7-1.2 m2/gm

Example 14

| Wire-bondable Top Conductor For "Mixed metal system" | |
| --- | --- |
| Gold powder | 78.0 |
| Frit #17 | 0.7 |

Ethyl cellulose/terpineol-based medium represents the balance

Gold powder PSD ~d50 4-5 um

Example 15

| Silver-Paladium Solderable Conductor | |
| --- | --- |
| Silver Powder | 51.0 |
| Paladium | 13.0 |

Ethyl cellulose/texanol-based medium represents the balance

Silver powder has irregular shape with a D50 particle size of 2.5 μm

The % light reflection the above metallization after co-firing with LTCC chip carrier at red (650 nm), green (510 nm), or blue (475 nm) light wavelength is, respectively, 49.4%, 42.2% or 40.7%.

Example 16

| Silver Conductor | |
| --- | --- |
| Silver Powder | 57.8 |
| Cuprous oxide | 1.0 |
| Frit #17 | 5.4 |

Ethyl cellulose/texanol-based medium represents the balance

Silver powder has irregular shape with a D50 particle size of 2.5 μm

The % light reflection the above metallization after co-firing with LTCC chip carrier at red (650 nm), green (510 nm), or blue (475 nm) light wavelength is, respectively, 67.4%, 65.7% or 64.6%.

Example 17

| Silver Via Fill Conductor | |
| --- | --- |
| Silver Powder | 87.6 |

Ethyl cellulose/texanol-based medium represents the balance

Silver powder has spherical shape with a D50 particle size of 2.5 μm

The % light reflection the above metallization after co-firing with LTCC chip carrier at red (650 nm), green (510 nm), or blue (475 nm) light wavelength is, respectively, 94.4%, 88.9% or 85.3%.

Example 18

| Silver Inner Signal Conductor | |
|---|---|
| Silver Powder | 65.0 |
| Frit #5 | 3.0 |

Ethyl cellulose/texanol-based medium represents the balance
Silver powder has irregular shape with a D50 particle size of 2.5 μm
The % light reflection the above metallization after co-firing with LTCC chip carrier at red (650 nm), green (510 nm), or blue (475 nm) light wavelength is, respectively, 94.2%, 92.0% or 91.3%.

Example 19

| Silver Inner Signal Conductor | |
|---|---|
| Silver Powder type A | 26.1 |
| Silver Powder type B | 55.6 |
| Frit #5 | 1.2 |

Ethyl cellulose/texanol-based medium represents the balance
Each of silver powders type A or B both has irregular shape with a D50 particle size of 2.5 μm or 8.2 μm, respectively
The % light reflection the above metallization after co-firing with LTCC chip carrier at red (650 nm), green (510 nm), or blue (475 nm) light wavelength is, respectively, 95.4%, 91.9% or 91.2%.

Example 20

| Silver Inner Signal Conductor | |
|---|---|
| Silver Powder | 77.0 |

Ethyl cellulose/texanol-based medium represents the balance
Silver powder has flake shape with a D50 particle size of 2.4 μm
The % light reflection the above metallization after co-firing with LTCC chip carrier at red (650 nm), green (510 nm), or blue (475 nm) light wavelength is, respectively, 97.9%, 96.4% or 95.4%.

Example 21

| Silver Inner Signal Conductor | |
|---|---|
| Silver Powder | 77.0 |
| Frit #17 | 0.5 |

Ethyl cellulose/texanol-based medium represents the balance
Silver powder has flake shape with a D50 particle size of 2.4 μm
The % light reflection the above metallization after co-firing with LTCC chip carrier at red (650 nm), green (510 nm), or blue (475 nm) light wavelength is, respectively, 95.4%, 92.5% or 91.2% when silver was fired upward, and 95.0%, 91.8%, or 90.3% when silver was fired downward (i.e. facing the setter).

Example 22

| Silver Inner Signal Conductor (DuPont 6742) | |
|---|---|
| Silver Powder | 77.0 |

Ethyl cellulose/texanol-based medium represents the balance
Silver powder has irregular shape with a D50 particle size of 8.2 μm
The % light reflection the above metallization after co-firing with LTCC chip carrier at red (650 nm), green (510 nm), or blue (475 nm) light wavelength is, respectively, 98.0%, 96.3% or 95.5%.

Example 23

| Silver Inner Signal Conductor | |
|---|---|
| Silver Powder | 77.0 |
| Frit #17 | 0.5 |

Ethyl cellulose/texanol-based medium represents the balance
Silver powder has irregular shape with a D50 particle size of 8.2 μm
The % light reflection the above metallization after co-firing with LTCC chip carrier at red (650 nm), green (510 nm), or blue (475 nm) light wavelength is, respectively, 95.3%, 92.2% or 91.0% when silver was fired upward, and 94.0%, 90.4%, or 88.9% when silver was fired downward (i.e. facing the setter).

Example 24

| Silver Inner Signal Conductor | |
|---|---|
| Silver Powder | 77.0 |

Ethyl cellulose/texanol-based medium represents the balance
Silver powder has flake shape with a D50 particle size of 3.7 μm The % light reflection the above metallization after co-firing with LTCC chip carrier at red (650 nm), green (510 nm), or blue (475 nm) light wavelength is, respectively, 98.2%, 96.6% or 95.5%.

Example 25

| Silver Inner Signal Conductor | |
|---|---|
| Silver Powder | 77.0 |
| Frit #17 | 0.5 |

Ethyl cellulose/texanol-based medium represents the balance
Silver powder has flake shape with a D50 particle size of 3.7 μm
The % light reflection the above metallization after co-firing with LTCC chip carrier at red (650 nm), green (510 nm), or blue (475 nm) light wavelength is, respectively, 95.2%, 91.9% or 90.4% when silver was fired upward, and 95.5%, 92.4%, or 90.9% when silver was fired downward (i.e. facing the setter).

Example 26

| Silver Inner Signal Conductor | |
|---|---|
| Silver Powder | 77.0 |

Ethyl cellulose/texanol-based medium represents the balance
Silver powder has irregular shape with a D50 particle size of 8.2 μm
The % light reflection the above metallization after co-firing with LTCC chip carrier at red (650 nm), green (510 nm), or blue (475 nm) light wavelength is, respectively, 98.7%, 97.7% or 97.0%.

Example 27

| Silver Inner Signal Conductor | |
|---|---|
| Silver Powder | 77.0 |
| Frit #17 | 0.5 |

Ethyl cellulose/texanol-based medium represents the balance
Silver powder has irregular shape with a D50 particle size of 8.2 μm
The % light reflection the above metallization after co-firing with LTCC chip carrier at red (650 nm), green (510 nm), or blue (475 nm) light wavelength is, respectively, 95.7%, 93.0% or 91.9% when silver was fired upward, and 94.8%, 91.3%, or 89.7% when silver was fired downward (i.e. facing the setter).

Example 28

| Silver Inner Signal Conductor | |
|---|---|
| Silver Powder | 77.0 |

Ethyl cellulose/texanol-based medium represents the balance
Silver powder has flake shape with a D50 particle size of 6.0 μm
The % light reflection the above metallization after co-firing with LTCC chip carrier at red (650 nm), green (510 nm), or blue (475 nm) light wavelength is, respectively, 98.8%, 97.7% or 97.0%.

Example 29

| Silver Inner Signal Conductor | |
|---|---|
| Silver Powder | 77.0 |
| Frit #17 | 0.5 |

Ethyl cellulose/texanol-based medium represents the balance
Silver powder has flake shape with a D50 particle size of 6.0 μm
The % light reflection the above metallization after co-firing with LTCC chip carrier at red (650 nm), green (510 nm), or blue (475 nm) light wavelength is, respectively, 94.0%, 90.3% or 88.6% when silver was fired upward, and 94.9%, 91.5%, or 89.9% when silver was fired downward (i.e. facing the setter).

Example 30

| Silver external wire bondable Conductor | |
|---|---|
| Silver Powder | 83.4 |
| Platinum Powder | 0.4 |
| Metallic Oxides | 0.4 |
| Bismuth Trioxide | 0.5 |

Ethyl cellulose/texanol-based medium represents the balance
Silver powder has flake shape with a D50 particle size of 2.0 μm
The % light reflection the above metallization after co-firing with LTCC chip carrier at red (650 nm), green (510 nm), or blue (475 nm) light wavelength is, respectively, 92.8%, 89.1% or 87.9% when silver was fired upward, and 92.4%, 88.3%, or 86.4% when silver was fired downward (i.e. facing the setter).

Table 3 compares the TCE and thermal conductivity of the above heat sink materials.

TABLE 3

| Joining Materials | TCE, 10E-6/C | Thermal Conductivity |
|---|---|---|
| Cu—W | 5-10 | 200 W/mK |
| Cu—Mo | 5-10 | 200 W/mK |
| Cu—Mo—Cu | 5-10 | 200 W/mK |
| Al—SiC | 3-15 | 150 W/mK |
| BeO | 5-7 | 260 W/mK |
| AlM | 4-5 | 200 W/mK |

What is claimed is:
1. A light emitting diode module having two or more LTCC (low temperature co-fired ceramic) tape layers;
each tape layer comprising 40 to 70 weight percent glass frit; 30 to 60 weight percent refractory ceramic filler;

0 to 10 weight percent of one or more inorganic pigments; dispersed in organic medium, wherein said refractory ceramic filler and said inorganic pigment have a refractive index in the range of 1.5 to 3.5 and said refractory ceramic filler has a flexural strength of at least 150 MPa;

having one or more cavities in said tape layers;

having at least two electrical vias and at least one thermal via in said tape layers;

having at least one functioning light emitting diode chip; wherein said LTCC (low temperature co-fired ceramic) tape layers provide a desired circuit pattern and said circuit pattern is electrically connected through said electrical vias, thus, forming a functioning chip carrier and wherein at least one functioning light emitting diode chip is mounted to said chip carrier and wherein at least one thermal via is connected to a heat sink and wherein said thermal via dissipates heat released from said functioning light emitting diode chip through its connection to said heat sink;

wherein at least three functioning light emitting diode chips are mounted to said chip carrier and wherein the color of said functioning light emitting diode chips is selected from white, red, green, and blue.

2. The light emitting diode module of claim 1 wherein said functioning light emitting diode chips have an operating wattage of equal to or greater than 0.5 watts.

3. The light emitting diode module of claim 1 wherein said functioning light emitting diode chips have an operating wattage of equal to or greater than 1.0 watts.

* * * * *